United States Patent
Jung

(10) Patent No.: US 8,558,316 B2
(45) Date of Patent: Oct. 15, 2013

(54) SEMICONDUCTOR DEVICE INCLUDING METAL SILICIDE LAYER AND FABRICATION METHOD THEREOF

(75) Inventor: Jong-ki Jung, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/343,280

(22) Filed: Jan. 4, 2012

(65) Prior Publication Data

US 2012/0175707 A1    Jul. 12, 2012

(30) Foreign Application Priority Data

Jan. 6, 2011    (KR) .................. 10-2011-0001551

(51) Int. Cl.
*H01L 29/76*    (2006.01)
*H01L 31/062*    (2012.01)

(52) U.S. Cl.
USPC ............ 257/368; 257/288; 438/495; 438/231

(58) Field of Classification Search
USPC ................. 257/288, 368, E27.06, E29.266; 438/495, 231
See application file for complete search history.

(56) References Cited

U.S. PATENT DOCUMENTS

| | | | |
|---|---|---|---|
| 6,593,217 B1 * | 7/2003 | Fujisawa .................... | 438/495 |
| 8,415,250 B2 * | 4/2013 | Alptekin et al. ............. | 438/666 |
| 2008/0020568 A1 | 1/2008 | Jang | |
| 2009/0184374 A1 * | 7/2009 | Clevenger et al. ............ | 257/368 |
| 2010/0123198 A1 | 5/2010 | Kim et al. | |

FOREIGN PATENT DOCUMENTS

| | | |
|---|---|---|
| KR | 1020080008584 | 1/2008 |
| KR | 1020090083671 | 8/2009 |
| KR | 1020100056813 | 5/2010 |

* cited by examiner

*Primary Examiner* — Theresa T Doan
(74) *Attorney, Agent, or Firm* — F. Chau & Associates, LLC

(57) ABSTRACT

A semiconductor device comprises a substrate, a gate structure formed on the substrate, a channel region below the gate structure in the substrate, a first source/drain region and a second source/drain region located at opposite side of the gate structure, a first lightly-doped drain (LDD) junction region formed between the first source/drain region and one end of the channel region, a second lightly-doped drain (LDD) junction region formed between the second source/drain region and the other end of the channel region, a metal silicide layer having a first metal formed on the first and second source/drain regions, an insulating layer formed on the metal silicide layer and the gate structure having a first opening to expose the metal silicide layer, and a conductive layer having the first metal and filling the first opening to contact the metal silicide layer.

19 Claims, 25 Drawing Sheets

CELL ARRAY REGION

PERIPHERAL CIRCUIT REGION

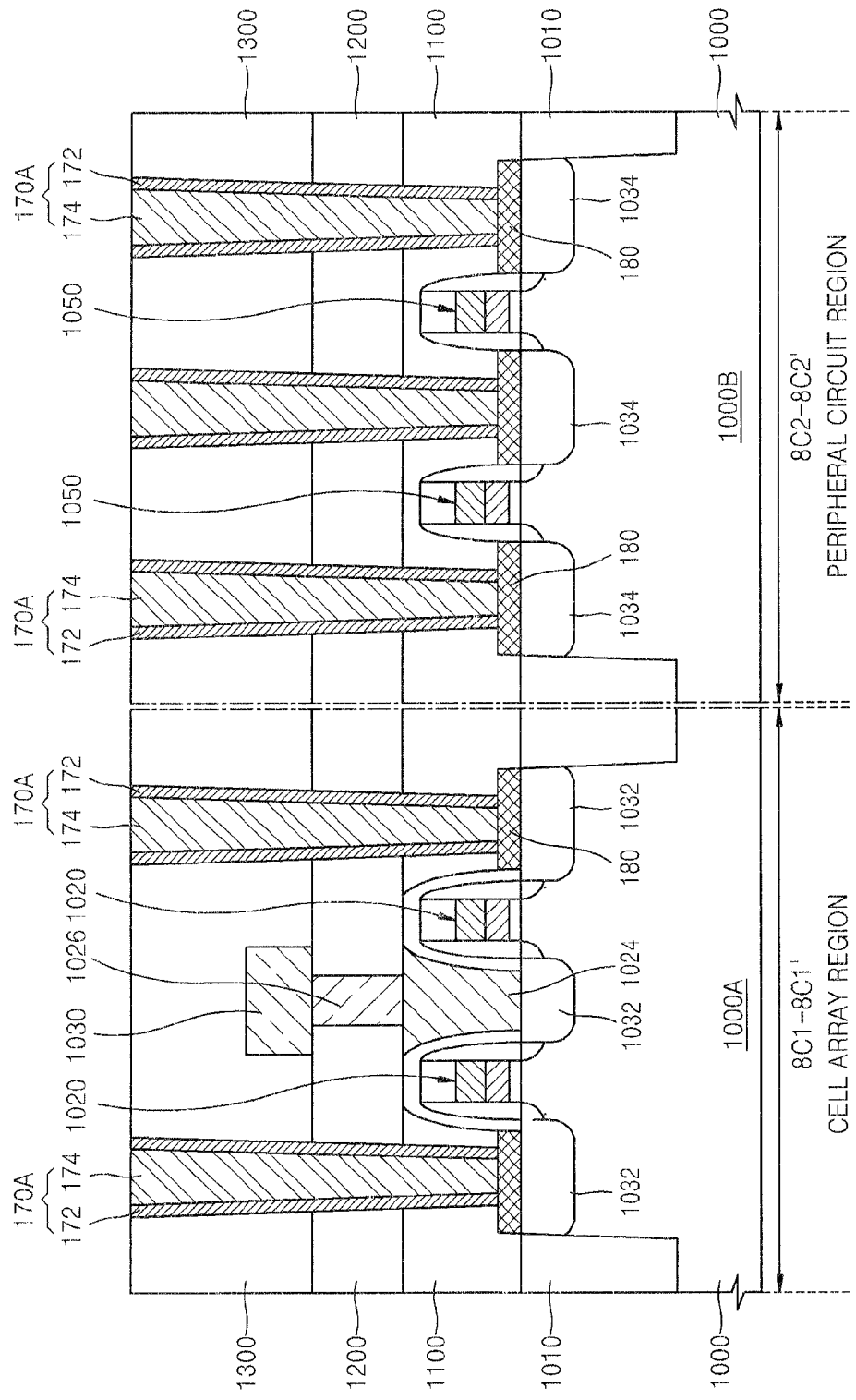

SEMICONDUCTOR DEVICE INCLUDING METAL SILICIDE LAYER AND FABRICATION METHOD THEREOF

CROSS-REFERENCE TO RELATED APPLICATIONS

This application claims the benefit of Korean Patent Application No. 10-2011-0001551, filed on Jan. 6, 2011, in the Korean Intellectual Property Office, the disclosure of which is incorporated herein in its entirety by reference.

FIELD

The inventive concept relates to a semiconductor device and a fabrication method thereof, and more particularly, to a semiconductor device including a metal silicide layer and a fabrication method thereof.

DISCUSSION OF RELATED ART

In scaling down a semiconductor device, the increase of contact resistance in source/drain regions greatly degrades the performance of the transistor. A need therefore exists for a transistor structure with reduced contact resistance.

SUMMARY OF THE INVENTION

According to an aspect of the inventive concept, a semiconductor device comprises a substrate, a gate structure formed on the substrate, a channel region below the gate structure in the substrate, a first source/drain region and a second source/drain region located at opposite side of the gate structure, a first lightly-doped drain (LDD) junction region formed between the first source/drain region and one end of the channel region, a second lightly-doped drain (LDD) junction region formed between the second source/drain region and the other end of the channel region, a metal silicide layer having a first metal formed on the first and second source/drain regions, an insulating layer formed on the metal silicide layer and the gate structure having a first opening to expose the metal silicide layer, and a conductive layer having the first metal and filling the first opening to contact the metal silicide layer.

The first conductive layer includes a barrier layer formed on an inner sidewall of the first opening and a contact plug formed on the barrier layer and the metal silicide, wherein the barrier layer includes the first metal. Alternatively, the first conductive layer is a single layer having the first metal.

The metal silicide layer is further formed on the first and second LDD junction regions. The first and second source/drain regions are formed in a recessed region of the substrate, wherein a top surface of the recessed region is positioned at the first LDD junction region and the second LDD junction. The metal silicide layer is further formed on the first and second LDD junction region.

The first metal is a metal selected from the group consisting of titanium (Ti), cobalt (Co), nickel (Ni), hafnium (Hf), platinum (Pt), and tungsten (W). The metal silicide layer is self-aligned with an upper surface of the first and second source/drain regions.

The gate structure has sidewalls on either side of the gate structure and the LDD junction region is formed under the sidewalls of the gate structure. The first and second source/drain regions are formed in a recessed region of the substrate, wherein a top surface of the recessed region is aligned with the first and second lightly-doped drain (LDD) junction regions. The metal silicide has a smaller electrical resistance than that of the first source/drain region, and the metal silicide has a thickness less than the junction depth of the first source/drain region. The gate structure includes polysilicon gate layer doped with impurities and a metal silicide gate layer stacked on the polysilicon gate layer.

According to another aspect of the inventive concept, a method of fabricating a semiconductor device comprises a step of forming a gate structure on a substrate, a step of forming a channel region below the gate structure, a step of forming a pair of LDD junction regions having a first junction depth at either end of the channel region, a step of forming a pair of source/drain regions having a second junction depth at either side of the gate structure, wherein the second junction depth is larger than the first junction depth, a step of forming an insulating layer having a first opening and an overhang part exposing the source/drain regions below the first opening and the overhang structure, a step of depositing a first metal layer including a first metal on the exposed source/drain regions and an inner sidewall of the first opening, and a step of selectively reacting the first metal with the exposed source/drain regions to form a metal silicide.

The method further comprises a step of depositing a second metal layer on the first metal layer to fill the first opening. The step of forming an insulating layer further comprises a step of forming a sacrificial layer on the source/drain regions, a step of forming the first opening, and a step of removing the sacrificial layer. The first metal layer fills the first opening. The step of depositing a metal layer is performed to fill the first opening. The metal silicide has a smaller electrical resistance than that of the first and second source/drain regions, and the metal silicide has a thickness less than the junction depth of the first source/drain region.

According to another aspect of the inventive concept, a semiconductor device comprises a substrate having an active region and an isolation region, a plurality of gate stack structures, each of gate stack structures locating between a first source/drain region and a second source/drain region, a plurality of channel regions under the corresponding gate stack structures, each of channel regions having a first LDD region formed between the first source/drain region and one end of the channel region and a second LDD region formed between the second source/drain region and the other end of the channel region, a metal silicide layer having a first metal formed on the active region other than the plurality of gate structures, an insulating layer having a plurality of openings to expose the metal silicide layer, and a plurality of conductive layers filling the openings and contacting the metal silicide layer.

Each of conductive layers includes a barrier layer having the first metal and a contact plug, the barrier layer being formed on an inner sidewall of the plurality of openings and the contact plug being formed on the barrier layer and the metal silicide layer.

BRIEF DESCRIPTION OF THE DRAWINGS

Exemplary embodiments of the inventive concept will be more clearly understood from the following detailed description taken in conjunction with the accompanying drawings in which:

FIGS. 8A through 8C are drawings illustrating structures of a DRAM device, according to an exemplary embodiment of the inventive concept;

DETAILED DESCRIPTION OF THE EMBODIMENTS

Figure 1A:
FIGS. 1A through 1G are cross-sectional views illustrating a semiconductor device and a method of fabricating the semiconductor device, according to an exemplary embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept. Like reference numerals in the drawings denote like elements, and thus their description will be omitted. In the drawings, the thicknesses of layers and regions are exaggerated for clarity.

The terminology used herein is for describing particular embodiments and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A through 1G are cross-sectional views illustrating a semiconductor device and a method of fabricating the semiconductor device, according to an exemplary embodiment of the inventive concept.

Referring to FIG. 1A, a substrate 100 is provided. The substrate 100 may be a silicon substrate or a silicon wafer. The substrate 100 may be a silicon layer. The substrate 100 may be a silicon layer which is epitaxially grown from another substrate.

Figure 1B:
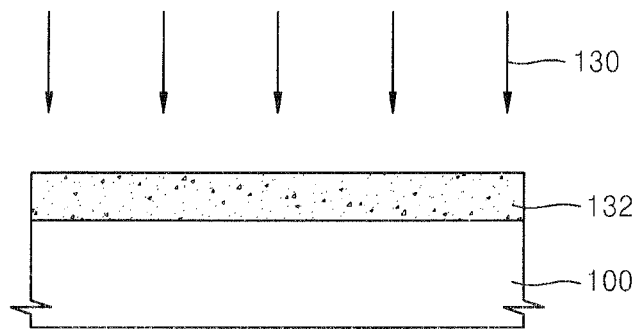

Referring to FIG. 1B, impurity ions 130 are implanted into the substrate 100 to form an impurity region 132. The impurity region 132 may be a source/drain region in a transistor. The impurity ions 130 may be n-type impurities or p-type impurities according to a channel type of the transistor. If an n-channel metal oxide semiconductor (NMOS) transistor is formed, n-type impurities, e.g., phosphorus (P) or arsenic (As), may be implanted into the substrate 100. If a p-channel metal oxide semiconductor (PMOS) transistor is formed, p-type impurities, e.g., boron (B) or $BF_2$, may be implanted into the substrate 100.

Figure 1C:
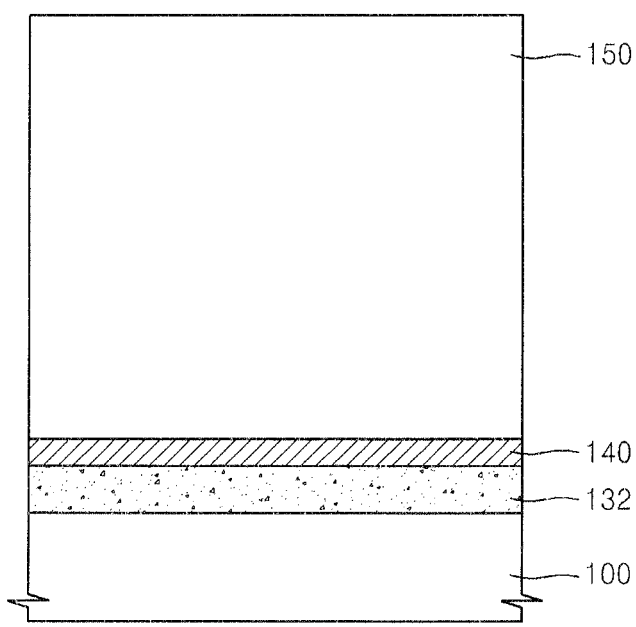

Referring to FIG. 1C, a sacrificial layer 140 is formed on the substrate 100 and covers the substrate 100. The sacrificial layer 140 may be formed at a low temperature, so that impurities of the impurity region 132 do not diffuse out from a implanted profile. The sacrificial layer 140 may be formed using a physical vapor deposition (PVD) process, a chemical vapor deposition (CVD) process, or an atomic layer deposition (ALD) process. The sacrificial layer 140 is formed of a silicon germanium (SiGe) layer. The sacrificial layer 140 may be formed to various thicknesses but may be formed to a thickness between about 100 nm and about 200 nm in consideration of a subsequent process. The sacrificial layer 140 may operate as an etch stopper in a subsequent process.

An insulating layer 150 is formed on the sacrificial layer 140. The insulating layer 150 is formed as a single layer in FIG. 1C, but a plurality of insulating layers may be formed. The insulating layer 150 may be formed of various types of material layers.

For example, the insulating layer 150 may be formed of an insulating layer formed of polysilazane-based inorganic spin-on-glass (SOG) or a photoresist layer. The insulating layer 150 may be formed of a borophosphosilicate glass (BPSG) oxide layer, a undoped silicate glass (USG) oxide layer, a flowable oxide (FOX) layer, a tetraethylorthosilicate (TEOS) oxide layer, or a high density chemical vapor deposition (HDP-CVD) oxide layer. The insulating layer 150 may be formed of a combination of an oxide layer and a nitride layer. The insulating layer 150 is not limited to a thickness shown in FIG. 1C but may be formed to various thicknesses.

Figure 1D:
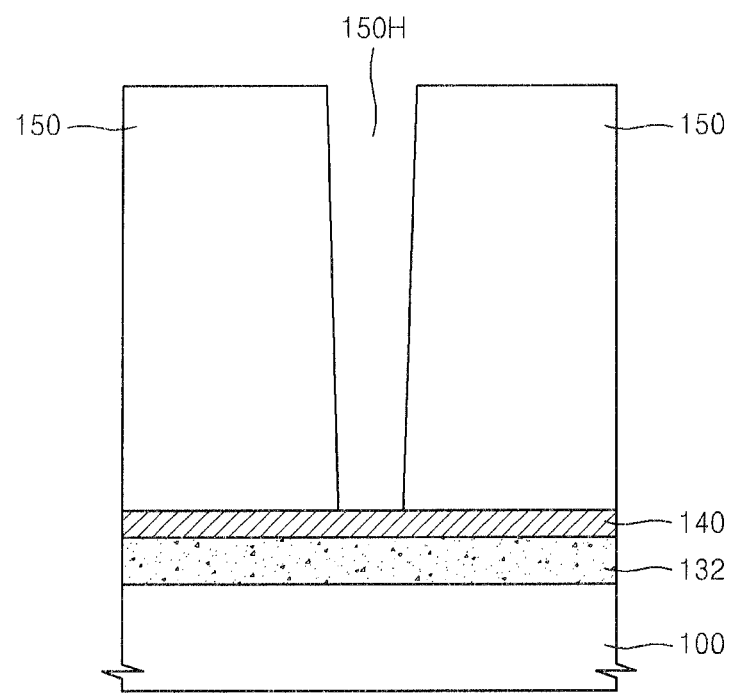

Referring to FIG. 1D, a first opening 150H is formed by a etching process using a photolithography process, exposing a part of the sacrificial layer 140. The first opening 150H may be one of a plurality of openings which are repeatedly formed in a plurality of positions of the insulating layer 150. When the first opening 150H is formed, the sacrificial layer 140 may operate as an etch stopper. Etching is stopped at an upper surface of the sacrificial layer 140 in FIG. 1D but may be stopped at a middle thickness of the sacrificial layer 140. When the first opening 150H is formed, the impurity region 132 is not damaged due to the sacrificial layer 140.

Figure 1E:
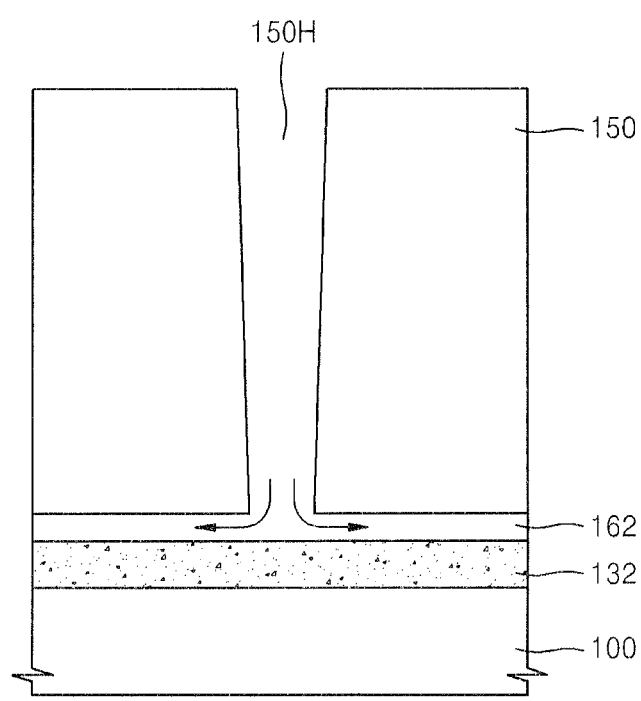

The first openings 150H may be a circular shaped opening when viewed from the top surface of the insulating layer 150. The circular shaped opening has width in a y-axis direction that is substantially the same with that in an x-axis direction as seen from the top surface of the insulating layer 150. Alternatively, the first openings 150H may be a rectangular shaped opening when viewed from the top surface of the insulating layer 150. The rectangular shaped opening may have width in the y-axis direction that is five times wider than that in the x-axis direction when viewed from the top surface of the insulating layer 150. Referring to FIG. 1E, a part of the sacrificial layer 140 is removed to form a second opening 162 which is connected to the first opening 150H. The sacrificial layer 140 may be removed by injecting an etchant into the first opening 150H, as indicated by arrows. The sacrificial layer 140 may be removed using a wet etch method. The sacrificial layer 140 may be removed using a mixture etchant of ammonia ($NH_3$) and hydrogen peroxide ($H_2O_2$). The sacrificial layer 140 may be removed using a polysilicon etchant. The second opening 162 is formed to extend along an upper surface of the substrate 100 between the substrate 100 and the insulating layer 150 due to the removal of the sacrificial layer 140. The first opening 150H is connected to the second opening 162 and thus vertically extends from the substrate 100 in the y-axis direction. The resultant structure of the first opening 150H and the second opening 162 combined forms an overhang structure of the insulating layer 150, below which an upper surface of the impurity region 132 is exposed.

Figure 1F:
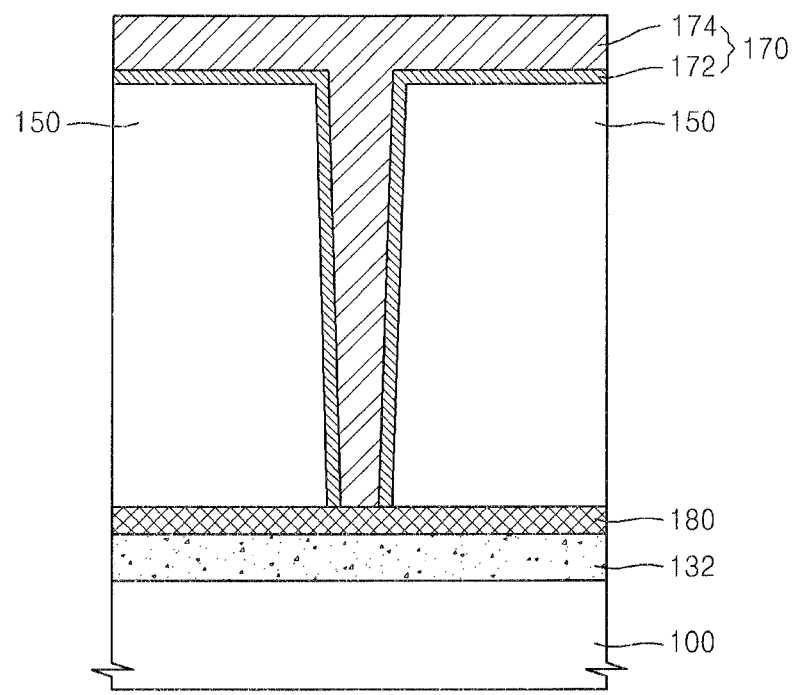

Referring to FIG. 1F, a conductive layer 170 is formed in the first opening 150H, and a metal silicide layer 180 fills the second opening 162. The metal silicide layer 180 extends in the second opening 162 underneath the conductive layer 170. The metal silicide layer 180 extends underneath the conductive layer 170 along an upper surface of the impurity region 162.

The conductive layer 170 has a liner which covers an inner sidewall of the first opening 150H. In other words, the conductive layer 170 includes a first conductive layer 172 including a first metal such as titanium (Ti), cobalt (Co), nickel (Ni), hafnium (Hp, platinum (Pt), tungsten (W), titanium nitride (TiN), or the like. The first conductive layer 172 may be a barrier layer. The first conductive layer 172 is directly connected to the metal silicide layer 180 and/or the impurity region 132. The metal silicide layer 180 may be formed of a metal silicide of which the first conductive layer 172 is formed.

The conductive layer 170 includes a second conductive layer 174 which is formed on the first conductive layer 172 and fills the other part of the first opening 150H. The second conductive layer 174 may be formed of a different metal material from or the same metal material as that of which the first conductive layer 172 is formed. For example, the second conductive layer 174 may be formed of aluminum (Al), W, or the like.

An example of forming the conductive layer 170 will now be described. The first conductive layer 172 may be formed of a Ti/TiN bilayer formed by depositing Ti layer on the sidewall of the first opening 150H and the upper surface of the impurity region 132 and sequentially stacking TiN layer on the Ti layer. In this case, the metal silicide layer 180, which fills an inner part of the second opening 162, may be formed as a result of a silicidation reaction between the Ti layer and the upper surface of the impurity region 132 as a titanium silicide layer. The silicidation reaction may occur spontaneously while Ti layer is depositing on the upper surface of the impurity region 132. Alternatively, the silicidation reaction may occur by an additional annealing process or heat budget resulted from subsequent processes. The conductive layer 170 may include a metal, and the metal silicide layer 180 may be a metal silicide layer which includes the metal included in the conductive layer 170.

The first conductive layer 172 may be formed using a PVD, CVD, or ALD process. For example, titanium tetrachloride ($TiCl_4$) may be used as a Ti source gas to form the Ti and/or TiN layer forming the first conductive layer 172 using the ALD or CVD process.

In particular, if the Ti/TiN bilayer is formed using the CVD process, $TiCl_4$ and $NH_3$ gases may be included as reaction gases. Argon (Ar) and nitrogen ($N_2$) may be included as carrier gases of the $TiCl_4$ gas, and $N_2$ may be included as a carrier gas of the $NH_3$ gas.

When the $TiCl_4$ gas is supplied into the first opening 150H, the first conductive layer 172 of the Ti/TiN bilayer is formed on the inner sidewall of the first opening 150H. Some of the $TiCl_4$ gas further flows into the second opening 162, and reacts with silicon of the impurity region 132 in the substrate 100. The process of forming the first conductive layer 172 is performed at a temperature between about 400° C. and 800° C., thereby the metal silicide layer 180 of a titanium silicide layer being formed as a result of spontaneous reaction between the Ti layer of the Ti/Ti bilayer 172 and the impurity region 132 during the process of forming the first conductive layer 172.

According to another exemplary embodiment, a Ti target may be used to form the Ti and/or TiN layer, which is the first conductive layer 172, using the PVD process. Some Ti particles, separating from the Ti target by sputtering when forming the Ti and/or TiN layer, are used to form the first conductive layer 172. The others of the Ti particles flow into the second opening 162 connected to the first opening 150H.

As described above, the others of the Ti particles, which flow into the second opening 162, react with the substrate 100, i.e., the impurity region 132 of the substrate 100, exposed in the second opening 162 at the process atmosphere for forming the first conductive layer 172, e.g., at the temperature between about 400° C. and about 800° C., thereby forming the metal silicide layer 180 of the titanium silicide layer.

Since the metal silicide layer 180 is formed in the second opening 162, the metal silicide layer 180 may be a thin film layer of a thickness between about 100 Å and about 200 Å located between the upper surface of the substrate 100 and the insulating layer 150. The second conductive layer 174 may be formed using a PVD or CVD process. For example, the conductive layer 174 may be formed of W.

Referring to FIG. 1F, the conductive layer 170 includes the first and second conductive layers 172 and 174, but the inventive concept is not limited thereto. For example, the conductive layer 170 may be formed of a single layer which fills the first opening 150H and may include a single metal such as Ti, Co, Hf, Pt, W, TiN, or the like. In this case, the same type of metal as the metal forming the single layer and the metal silicide layer 180 formed of a resultant material by the reaction with the substrate 100 may be formed in the second opening 162.

Figure 1G:
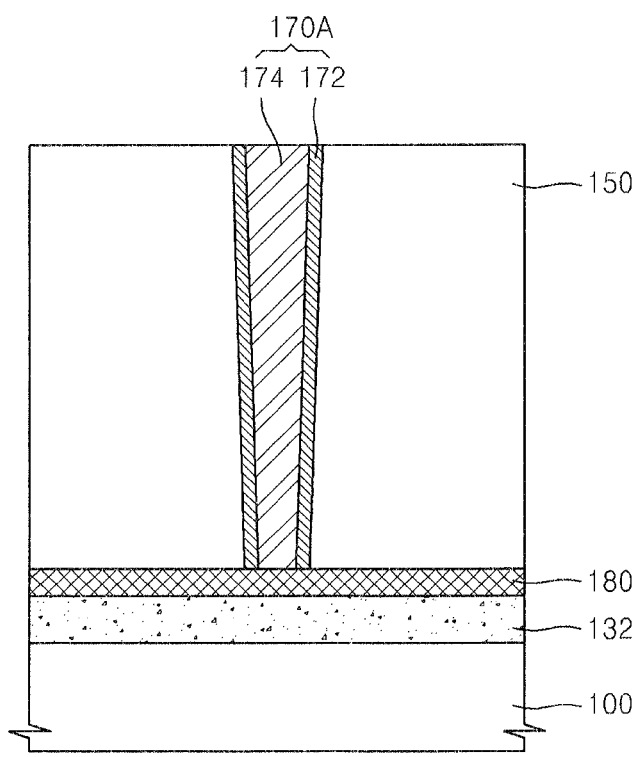

Referring to FIG. 1G, the conductive layer 170 is planarized by using chemical mechanical polishing (CMP) or etch back. The planarization process may be performed until the upper surface of the insulating layer 150 is exposed, thereby forming a contact plug 170A of a part of the conductive layer 170 remaining in the first opening 150H. In other words, the contact plug 170A is formed of the first and second conductive layers 172 and 174 formed in the first opening 150H. The contact plug 170A includes the first conductive layer 172 in FIG. 1G. However, if the first conductive layer 172 is a barrier layer, the contact plug 170A may include the second conductive layer 174 except for the first conductive layer 172.

Examples of applying the semiconductor device and the method of FIGS. 1A through 1G to a fabrication of a transistor will now be described. Exemplary embodiments of the inventive concept described below may be applied to fabrications of various types of semiconductor devices. For example, the exemplary embodiments of the inventive concept may be applied to various types of devices such as a dynamic random access memory (DRAM), a flash memory, a phase-change RAM (PRAM), a ferroelectric RAM (FRAM), a magnetic RAM (MRAM), a static RAM (SRAM), logic elements and a flash memory mounted on one chip, an embedded memory logic including memory devices such as a DRAM or an SRAM, a complementary metal-oxide semiconductor (CMOS) image sensor, etc. The exemplary embodiments of the inventive concept may also be applied to various types of regions of these devices, such as cell array regions, core regions, peripheral circuit regions, logic regions, input/output regions, etc.

FIGS. 2A through 2J are cross-sectional views illustrating a semiconductor device and a method of fabricating the semiconductor device, according to another exemplary embodiment of the inventive concept.

The same reference numerals of FIGS. 2A through 2J as those of FIGS. 1A through 1G denote the same elements, and thus their detailed descriptions will be omitted herein.

Figure 2A:
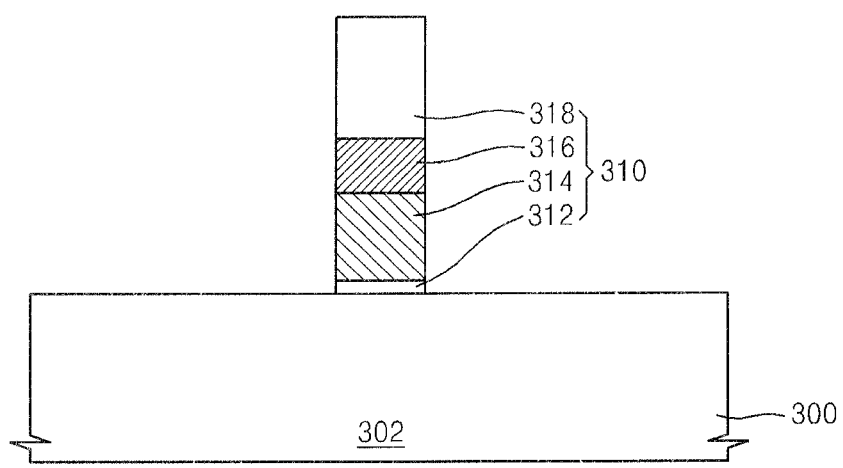
FIGS. 2A through 2J are cross-sectional views illustrating a semiconductor device and a method of fabricating the semiconductor device, according to another exemplary embodiment of the inventive concept.

Referring to FIG. 2A, a substrate 300, e.g., a silicon substrate, is provided. The substrate 300 corresponds to the substrate 100 of FIG. 1A. An isolation layer (not shown) is formed in the substrate 300 to define an active region 302. A gate insulating layer 312, a first gate conductive layer 314, a second gate conductive layer 316, and a capping insulating layer 318 are sequentially stacked on the active region 302 to form a gate stack 310.

The active region 302 may be a cell array region or a peripheral circuit region of the semiconductor device. The active region 302 may be NMOS region or a PMOS region. Although not shown, the active region 302 may include a p-type doped region or an n-type doped region or both of the p-type and n-type doped regions according to conductive type and kind of a unit device to be formed in the active region 302.

The gate insulating layer 312 may be formed of a silicon oxide layer, a silicon nitride layer, a silicon oxynitride layer, a high-k dielectric layer, or combinations of them. The first gate conductive layer 314 may be formed of polysilicon doped with impurities. The second gate conductive layer 316 may be formed of metal silicide, e.g., tungsten silicide. The capping insulating layer 318 may be formed of a silicon nitride layer.

Figure 2B:
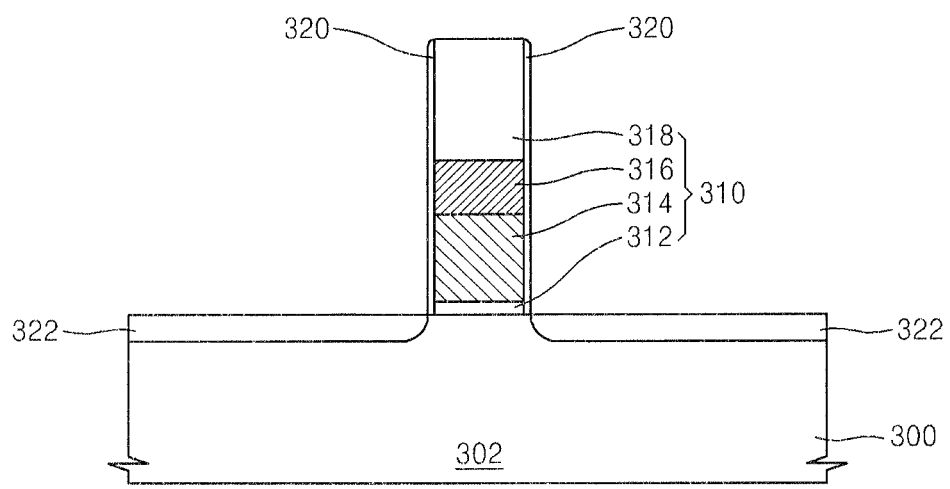

Referring to FIG. 2b, an offset insulating layer 320 is formed to uniformly cover both sidewalls of the gate stack 310. To form the offset insulating layer 320, an insulating layer is formed to uniformly cover an exposed surface of the gate stack 310 and an upper surface of the substrate 300 and then is etched back so that the offset insulating layer 320 remains. The offset insulating layer 320 may be formed of a silicon nitride layer.

A lightly-doped drain (LDD) ion implantation process is performed with respect to the substrate 300 using the gate stack 310 and the offset insulating layer 320 as ion implantation masks, thereby forming an LDD junction region 322 in parts of the substrate 300 at both sides of the gate stack 310.

A halo ion implantation process may be performed to form a halo ion implantation region (not shown) in a part of the active region 302 adjacent to an edge of a lower part of the gate stack 310. The halo ion implantation region may be selectively formed. The halo ion implantation region may have the same conductive type as that of the active region 302. For example, if the active region 302 is a p-type impurity region, p-type impurity ions may be injected to form the halo ion implantation region. The halo ion implantation process may be performed before the offset insulating layer 320 is formed.

Figure 2C:
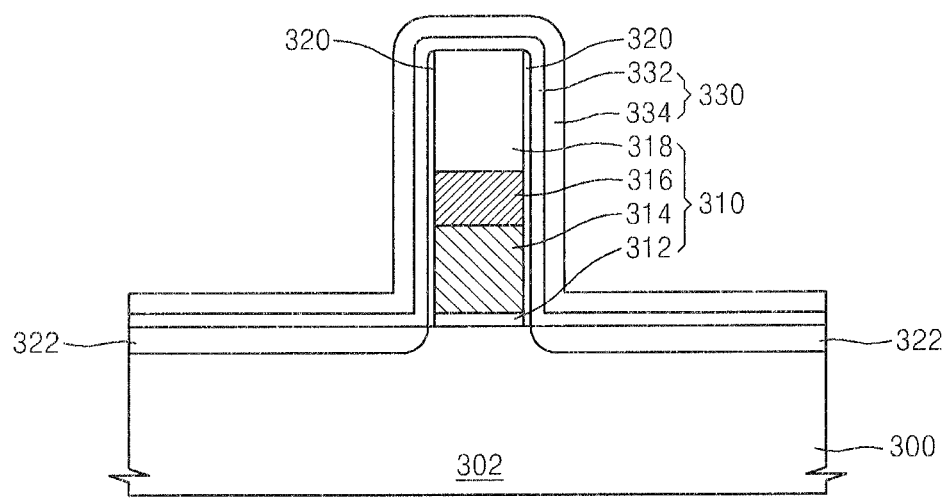

Referring to FIG. 2C, a spacer insulating layer 330 is formed to cover an upper surface of the gate stack 310, an exposed surface of the offset insulating layer 320, and an exposed surface of the substrate 300. The spacer insulating layer 330 may be formed of a silicon oxide layer, a silicon nitride layer, or a combination of them. The spacer insulating layer 330 is formed in a dual layer structure of a silicon nitride layer 332 and a silicon oxide layer 334 in FIG. 2C, but the inventive concept is not limited thereto.

Figure 2D:
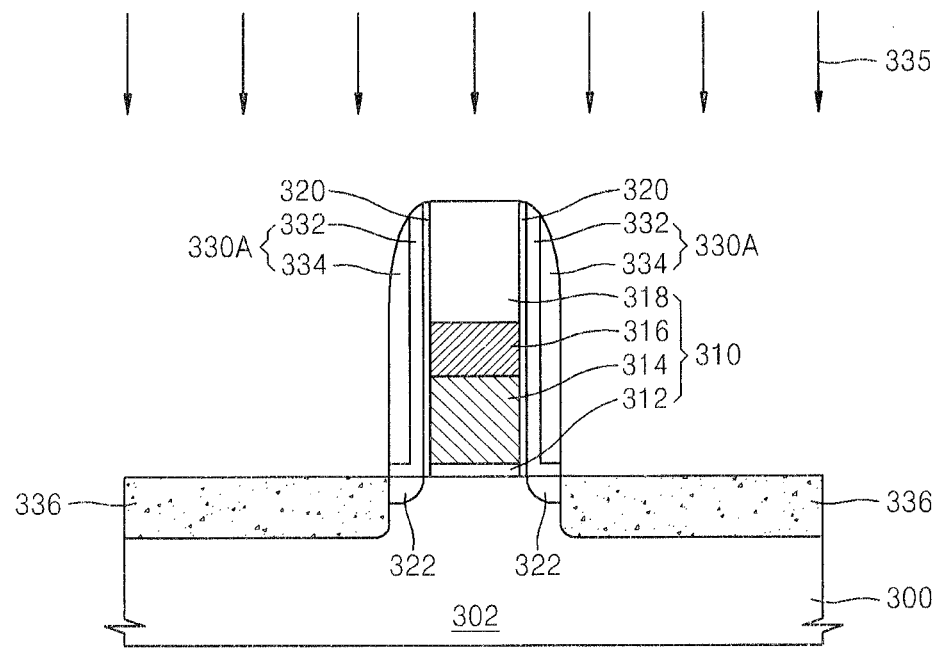

Referring to FIG. 2D, the spacer insulating layer 330 is etched back until the upper surface of the substrate 300 is exposed, to form an insulating spacer 330A on the substrate 300. Here, the insulating spacer 330A covers the offset insulating layer 320 on both sidewalls of the gate stack 310.

Impurity ions 335 for forming source and/drain regions are injected into the substrate 300 using the gate stack 310, the offset insulating layer 320, and the insulating spacer 330A as ion implantation masks to form source/drain regions 336. The impurity ions 335 that was injected into source/drain regions are activated using an annealing process to form the source/drain regions 336 in FIG. 2D. However, if the impurity ions 335 are not activated, the source/drain regions 336 may be formed in a subsequent process.

Figure 2E:
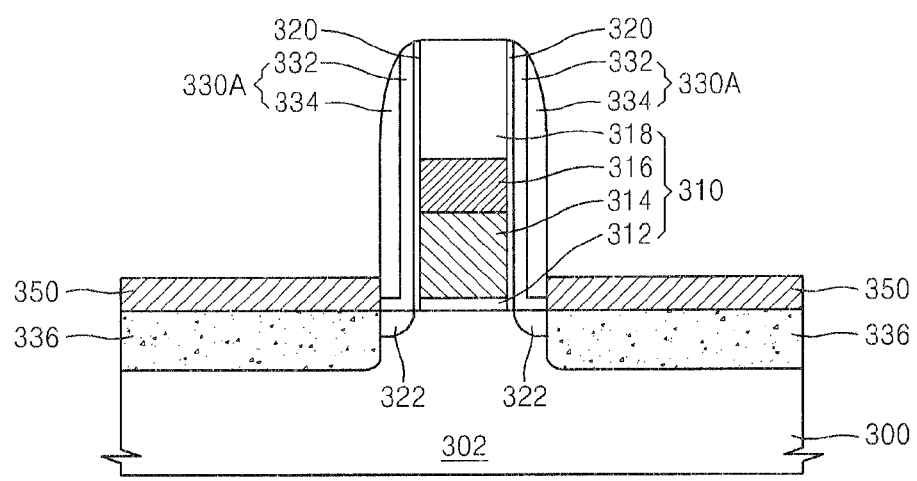

Referring to FIG. 2E, a sacrificial layer 350 is formed to cover the source/drain regions 336. The sacrificial layer 350 of FIG. 2E corresponds to the sacrificial layer 140 of FIG. 1C. The sacrificial layer 350 extends to the insulating spacer 330A on the source/drain regions 336 in the substrate 300. The sacrificial layer 350 is formed on the active region 302 of the substrate 100 including the source/drain regions 336. The sacrificial layer 350 may be formed of a SiGe layer which may be formed in a low temperature process. The sacrificial layer 350 may operate as an etch stopper in a subsequent process of etching the insulating layer. The sacrificial layer 350 may be formed using a plasma-enhanced CVD (PECVD) process at a low temperature less than 600° C., e.g., a relative low temperature between about 200° C. and about 400° C.

Figure 2F:
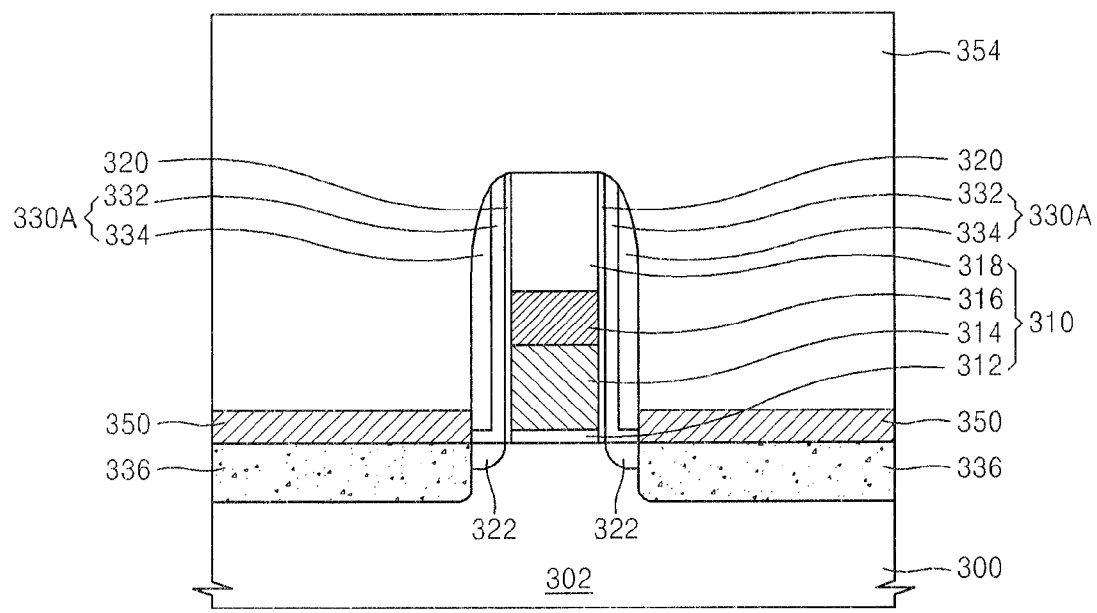

Referring to FIG. 2F, an insulating layer 354, i.e., an interlayer insulating layer, is formed to cover the gate stack 310, the insulating spacer 330A, and the sacrificial layer 350. A process of forming the insulating layer 354 may include a process including a relatively high temperature condition between about 600° C. and about 800° C.

For example, the insulating layer 354 may be formed of a polysilazane-based inorganic SOG layer such as Tonen Silazene (TOSZ). The process of forming the insulating layer of TOSZ may include a process of coating TOSZ on the sacrificial layer 350 using a spin coating method and a process of heat treatment of the coated TOSZ. The heat treatment may include a pre-baking step performed at a relative low temperature between about 150° C. and about 200° C., and then a hard-baking step performed at a relatively high temperature between about 600° C. and about 800° C.

The impurity ions 335 in the source/drain regions 336 may be activated due to relatively high temperature heat treatment when the insulating layer 354 is formed at a relatively high temperature between about 600° C. and about 800° C.

Figure 2G:
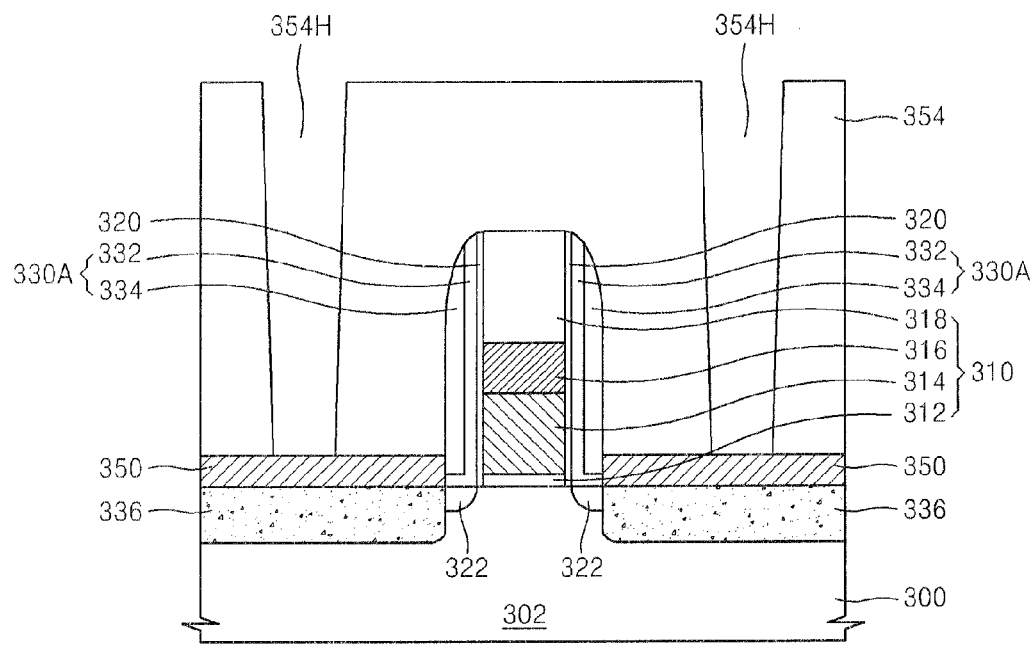

Referring to FIG. 2G, first openings 354H may penetrate the insulating layer 354 and expose the sacrificial layer 350 at the bottom of the first openings 354H. The first openings 354H may be a circular shaped opening when viewed from the top surface of the insulating layer 354. The circular shaped opening has width in a y-axis direction that is substantially the same with that in an x-axis direction as seen from the top surface of the insulating layer 354. Alternatively, the first openings 354H may be a rectangular shaped opening when viewed from the top surface of the insulating layer 354. The rectangular shaped opening may have width in the y-axis direction that is much wider than that in the x-axis direction when viewed from the top surface of the insulating layer 354.

Figure 2H:
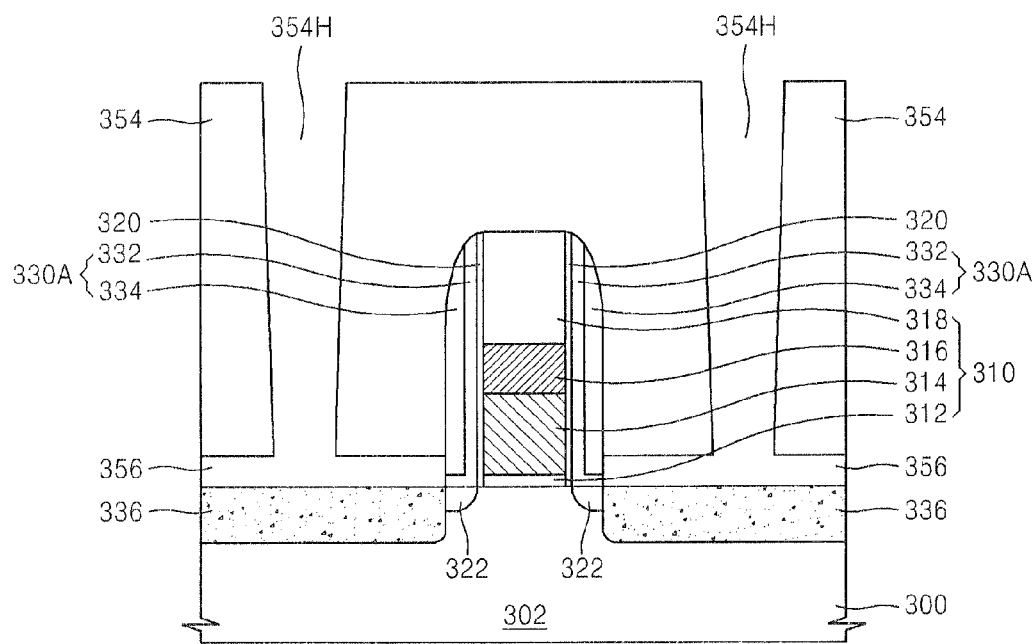

Referring to FIG. 2H, second openings 356 are formed by removing the sacrificial layer 350. Therefore, the second openings 356 are formed between the substrate 300 and the insulating layer 354. The second openings 356 extend along the upper surface of the substrate 300, connecting to the first openings 354H. The second openings 356 expose upper surfaces of the source/drain regions 336. The resultant structure of the first openings 354H and the second openings 356 forms overhang structure, below which upper surfaces of the source/drain regions 336 are exposed.

A plug ion implantation is performed using the overhang structure as an implantation mask to form low resistance contacts on the substrate 300 exposed by the first openings 354H. The plug ion implantation is performed using impurity ions having the same conductive type as that of the impurity ions 335 for forming source/drain regions.

Figure 2I:
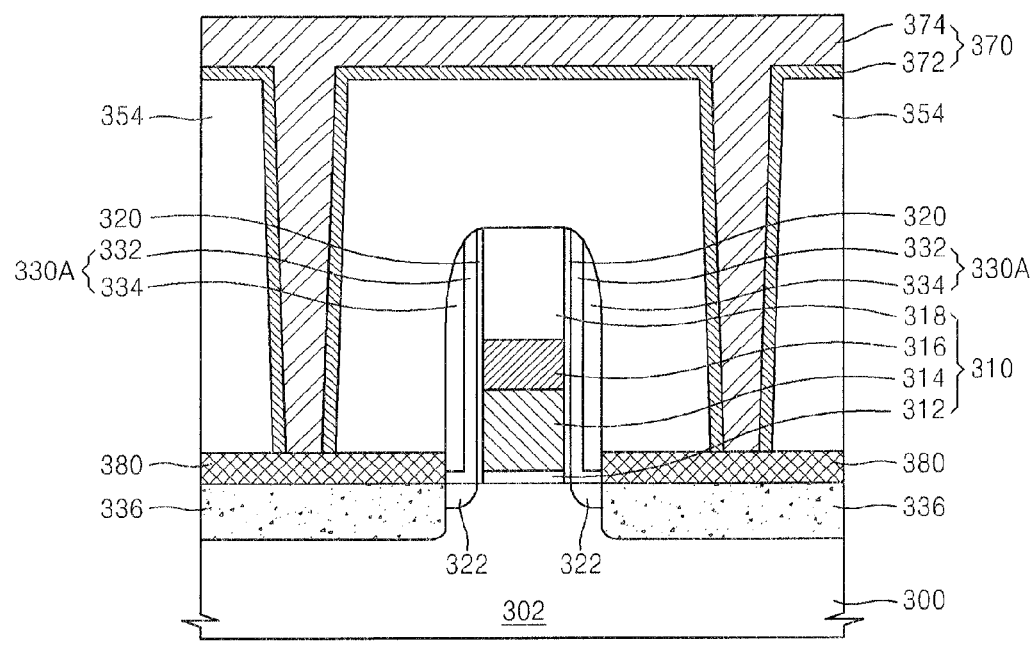

Referring to FIG. 2I, a conductive layer 370 is formed in the first openings 354H, and simultaneously, a metal silicide layer 380 fills the second opening 356 according to a similar method to that of forming the conductive layer 170 and the metal silicide layer 180 described with reference to FIG. 1F. The metal silicide layer 380 extends underneath the conductive layer 370 to the insulating spacer 330A along upper surfaces of the source/drain regions 336.

The metal silicide layer 380 is formed in the second openings 356 which are very narrow spaces formed between the insulating layer 354 and the source/drain regions 336 of the substrate 300. Therefore, the metal silicide layer 380 maintains a thin thickness on the substrate 300. The metal silicide layer 380 may have a thickness for realizing desired characteristics of the semiconductor device within a thickness range between about 100 Å and about 200 Å.

The conductive layer 370 has a line shape which covers inner sidewalls of the first openings 354H. The conductive layer 370 includes a first conductive layer 372 which includes a metal such as Ti, Co, Ni, Hf, Pt, W, or the like. The first conductive layer 372 may be a barrier layer. The conductive layer 370 includes a second conductive layer 374 which is formed on the first conductive layer 372 and fills the other spaces of the first openings 354H.

For example, the first conductive layer 372 may be formed of a Ti and/or TiN layer which is formed by sequentially stacking Ti and TiN. In this case, the metal silicide layer 380 filling the second openings 356 may be formed of a titanium silicide layer. The second conductive layer 374 may be formed of W.

The conductive layer 370 includes the first and second conductive layers 372 and 374 in FIG. 2I, but the inventive concept is not limited thereto. For example, the conductive layer 370 may be formed as a single layer which fills the first openings 354H, and the single layer may include a metal such as Ti, Co, Ni, Hf, Pt, W, or the like. In this case, the metal silicide layer 380 may be formed of a resultant material which is formed through a reaction between the same type of metal as the metal forming the single layer and the substrate 300.

Figure 2J:
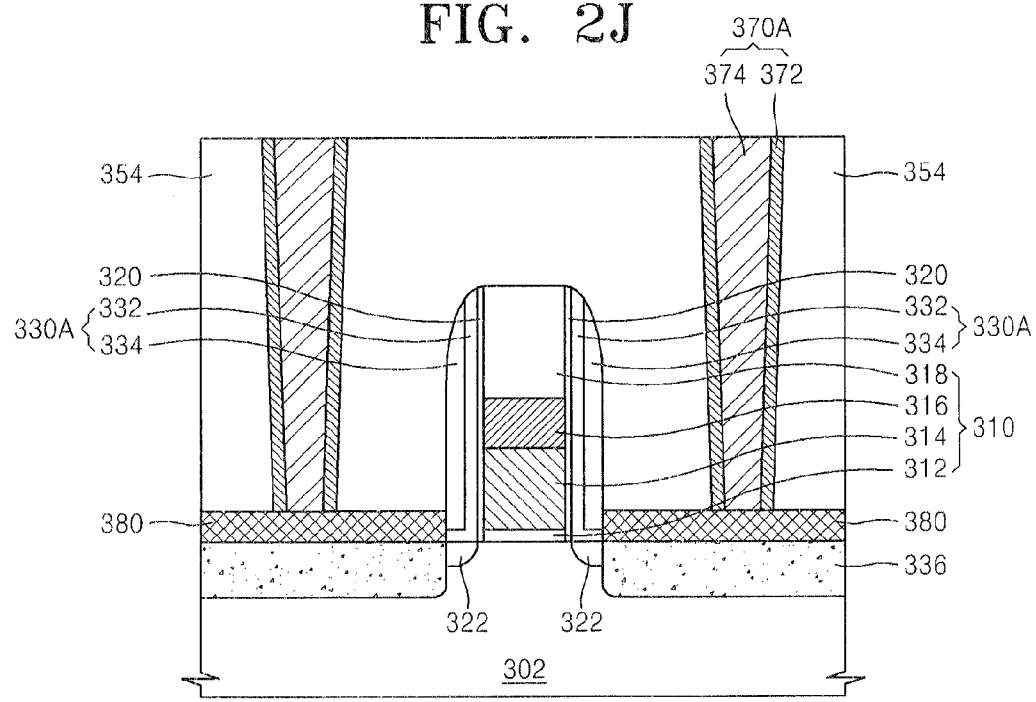

Referring to FIG. 2J, the conductive layer 370 is etched using CMP or etch back until an upper surface of the insulating layer 354 is exposed, to form contact plugs 370A of parts of the conductive layers 370 remaining in the first openings 354H.

According to the semiconductor device and the method described with reference to FIGS. 2A through 2J, a gate length in a transistor decreases with a decrease in a feature size of the semiconductor device. Therefore, a resistance of the LDD junction region 322, which is an extension region, and a resistance of the source/drain regions 336 are prevented from affecting a driving current of the semiconductor device.

In other words, the metal silicide layer 380 having a minute thickness is formed on the source/drain regions 336 to reduce the resistance of the source/drain regions 336 without an increase in the resistance of the LDD junction region 322, thereby improving a performance of the transistor.

A thermal budget in processes necessary for fabricating the semiconductor device is used without adding a process of forming the metal silicide layer 380. Also, a metal source or a metal precursor is used to form a conductive layer which is necessarily formed to realize the semiconductor device. Therefore, the metal silicide layer 380 is additionally formed simultaneously with performing processes necessary for fabricating the semiconductor device. Accordingly, as in a process of forming a conventional metal silicide layer, an agglomeration or a short channel effect of the conventional metal silicide layer, which may occur due to a subsequent process having a great thermal budget after the conventional metal silicide layer, may be solved.

Also, according to the semiconductor device and the method described with reference to FIGS. 2A through 2J, the metal silicide layer 380 having the minute thickness is formed using a thermal budget, which is not avoided in processes necessary for realizing the semiconductor device, without avoiding the process having the great thermal budget before the metal silicide layer 380 is formed. Therefore, the resistance of the source/drain regions 336 is effectively reduced due to the thermal budget which is reduced by the metal silicide layer 380. Thus, an ion implantation process is performed with having a process margin sufficient for the thermal budget when ions for forming the source/drain regions 336 are injected, thereby forming the source/drain regions 336 necessary for realizing the desired characteristics of the semiconductor device.

FIGS. 3A through 3F are cross-sectional views illustrating a semiconductor device and a method of fabricating the semiconductor device, according to another exemplary embodiment of the inventive concept.

The same reference numerals of FIGS. 3A through 3F as those of FIGS. 2A through 2J denote the same elements, and thus their detailed descriptions will be omitted herein. The current embodiment is the same as the previous embodiment except that a sacrificial layer 450 is formed on an LDD junction region 322, and thus a metal silicide layer 480 is formed on the LDD junction region 322.

In more detail, according to the same process as that described with reference to FIGS. 2A through 2D, a gate stack 310 is formed on a substrate 300, and an offset insulating layer 320 and an insulating spacer 330A are formed on both sidewalls of the gate stack 310. The LDD junction region 322 and source/drain regions 336 are formed in the substrate 300.

Figure 3A:
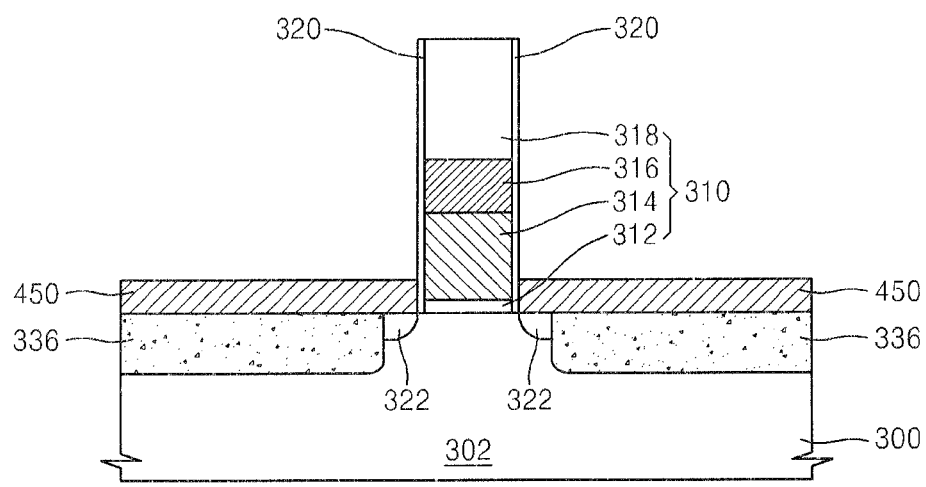
FIGS. 3A through 3F are cross-sectional views illustrating a semiconductor device and a method of fabricating the semiconductor device, according to another exemplary embodiment of the inventive concept.

Referring to FIG. 3A, the insulating spacer 330A is removed to expose the LDD junction region 322 formed in the substrate 300. The sacrificial layer 450 is formed on the source/drain regions 336 using the same method as that described with reference to FIG. 2E. The sacrificial layer 450 corresponds to the sacrificial layer 350 of FIG. 2E, and thus its detailed descriptions will be omitted. However, in FIG. 3A, the sacrificial layer 450 is formed on the source/drain regions 336 and the LDD junction region 322.

Figure 3B:
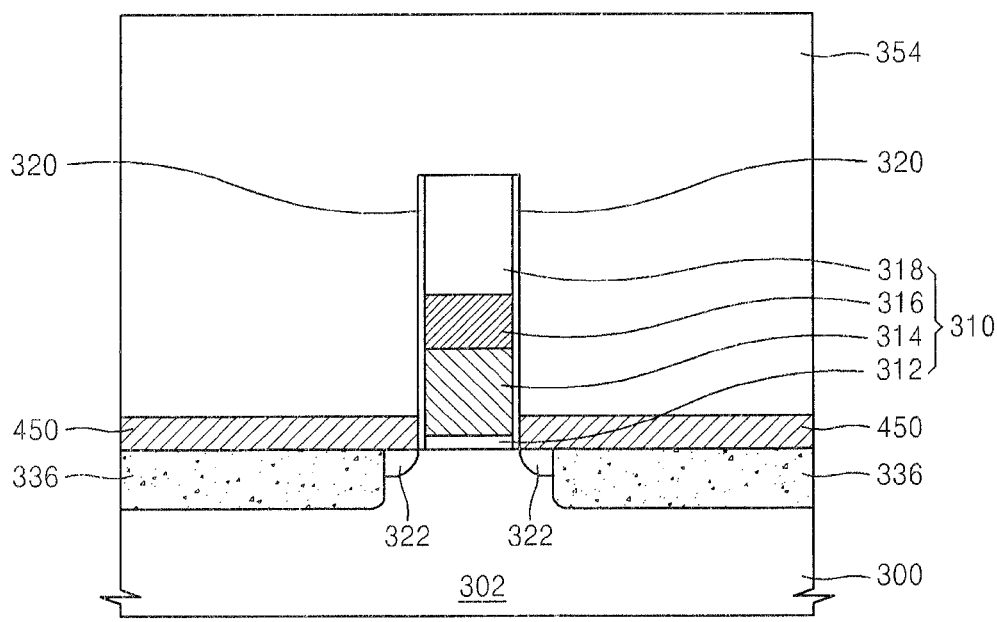

Referring to FIG. 3B, according to the same process as that described with reference to FIG. 2F, an insulating layer 354 is formed to cover the gate stack 310 and the sacrificial layer 450. A process of forming the insulating layer 354 is the same as that described with reference to FIG. 2F, and thus its descriptions will be omitted.

Figure 3C:
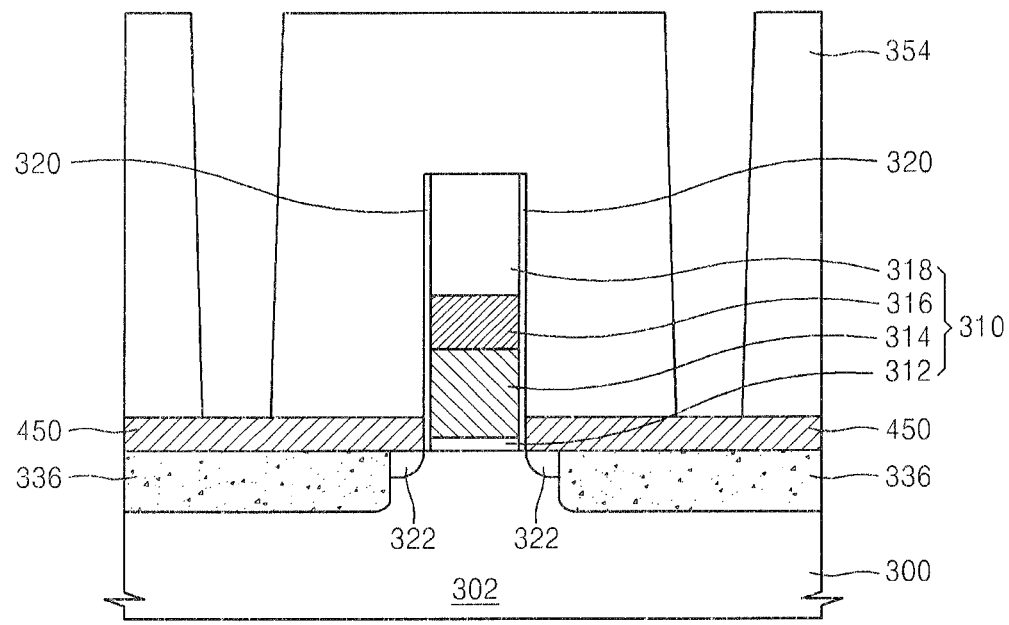

Referring to FIG. 3C, according to the same process as that described with reference to FIG. 2G, a part of the insulating layer 354 is etched to form first openings 354H which extends in the y-direction from the substrate 300 and expose the sacrificial layer 450. A process of forming the first openings 354H is the same as that described with reference to FIG. 2G, and thus its descriptions will be omitted herein.

Figure 3D:
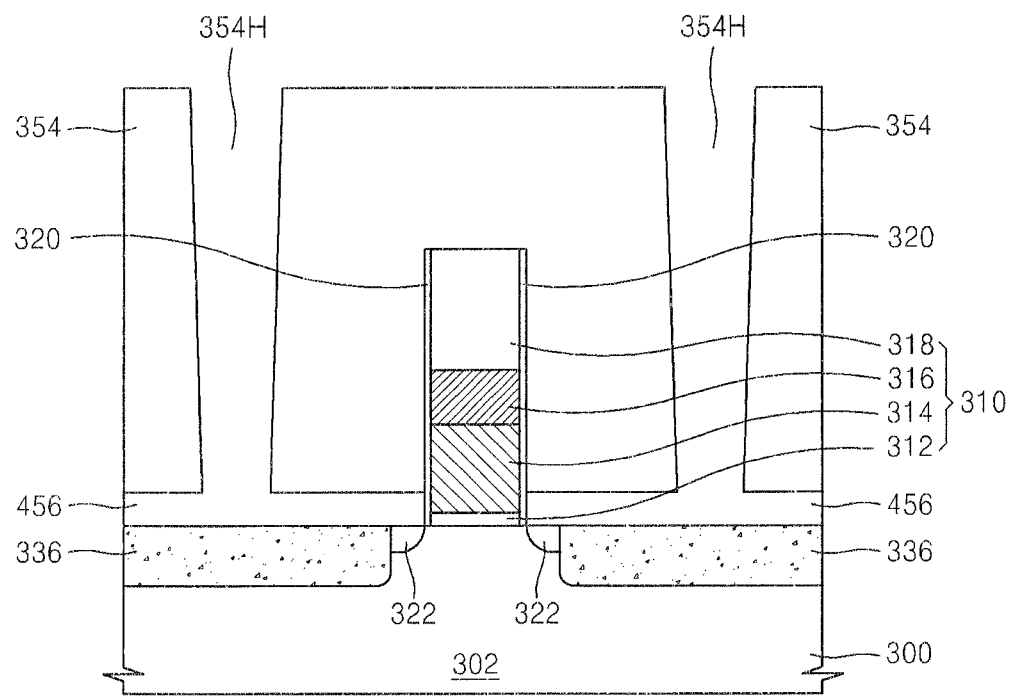

Referring to FIG. 3D, according to the same process as that described with reference to FIG. 2H, the sacrificial layer 450 is removed through the first openings 354H. Therefore, second openings 456 are formed between the substrate 300 and the insulating layer 354 to connect to the first openings 354H and extend along an upper surface of the substrate 300. The second openings 456 expose upper surfaces of the LDD junction region 322 and the source/drain regions 336. The second openings 456 extend to upper surfaces of the source/drain regions 336 and an upper surface of the LDD junction region 322.

Figure 3E:
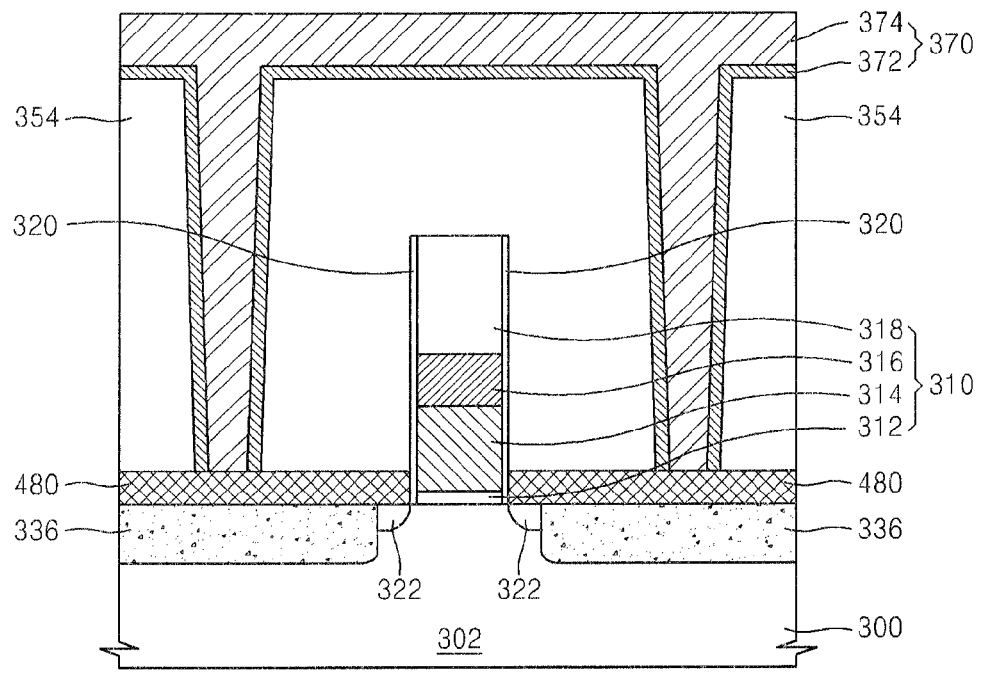

Referring to FIG. 3E, according to the same process as that described with reference to FIG. 2I, a conductive layer 370 is formed in the first openings 354H, and the metal silicide layer 480 fills the second openings 456. Differently from the process described with reference to FIG. 2I, the metal silicide layer 480 extends on the upper surfaces of the source/drain regions 336 and the upper surface of the LDD junction region 322. The metal silicide layer 480 extends underneath the conductive layer 370 to the gate stack 310 along the upper surfaces of the source/drain regions 336 and the LDD junction region 322.

The metal silicide layer 480 is formed in the second openings 456 which are very narrow spaces formed between the insulating layer 354 and the source/drain regions 336 and between the insulating layer 354 and the LDD junction region 322. Therefore, the metal silicide layer 480 maintains a thin thickness on the substrate 300. The metal silicide layer 480 may have a thickness necessary for realizing desired characteristics of the semiconductor device within in a thickness range between about 100 Å and about 200 Å. A process of forming the conductive layer 370 is the same as that described with reference to FIG. 2I, and thus its descriptions will be omitted for convenience.

Figure 3F:
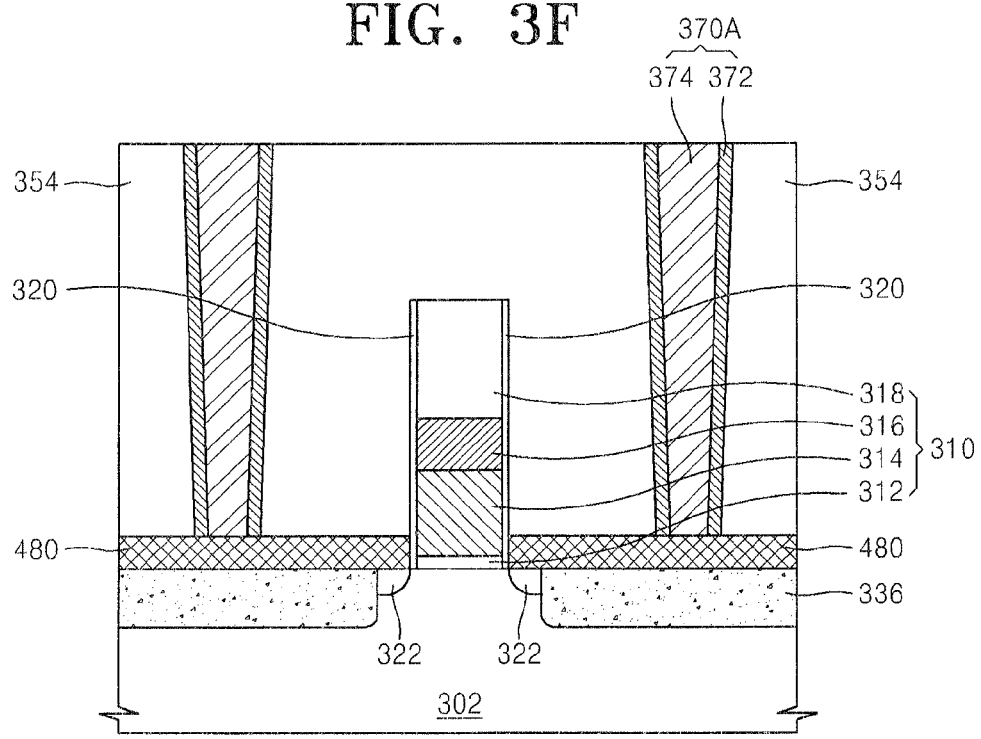

Referring to FIG. 3F, according to the same process as that described with reference to FIG. 2J, the conductive layer 370 is etched using CMP or etched back until the upper surface of the insulating layer 354 is exposed. Therefore, contact plugs 370A are formed of parts of the conductive layer 370 remaining in the first openings 354H.

According to the semiconductor device and the method described with reference to FIGS. 3A through 3F, the same effects as those of the method described with reference to FIGS. 2A through 2J are obtained.

Also, the metal silicide layer 480 is formed to extend on the upper surfaces of the source/drain regions 336 and the upper surface of the LDD junction region 322. Therefore, a resistance of the source/drain regions 336 and a resistance of the LD junction region 322, which is an extension region, are simultaneously reduced, thereby further improving a performance of a transistor.

Figure 4A:
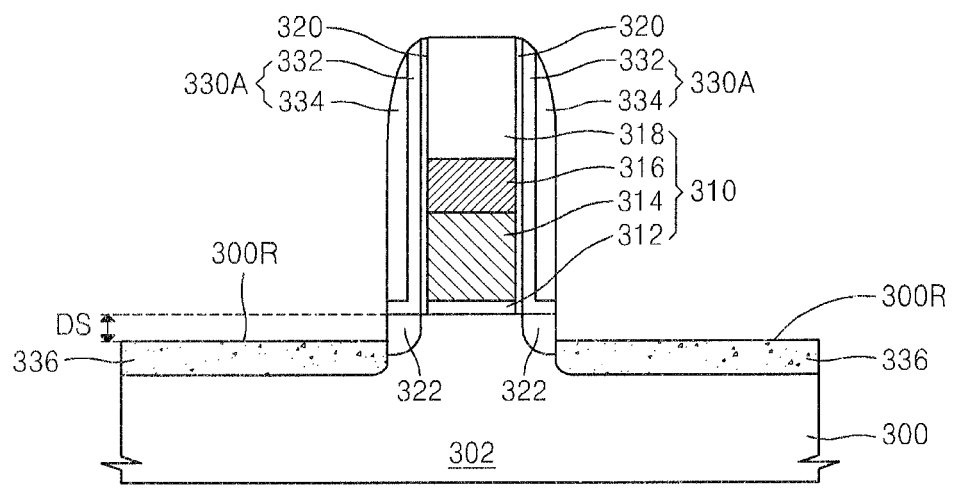
FIGS. 4A through 4C are cross-sectional views illustrating a semiconductor device and a method of fabricating the semiconductor device, according to another exemplary embodiment of the inventive concept.
Figure 4B:
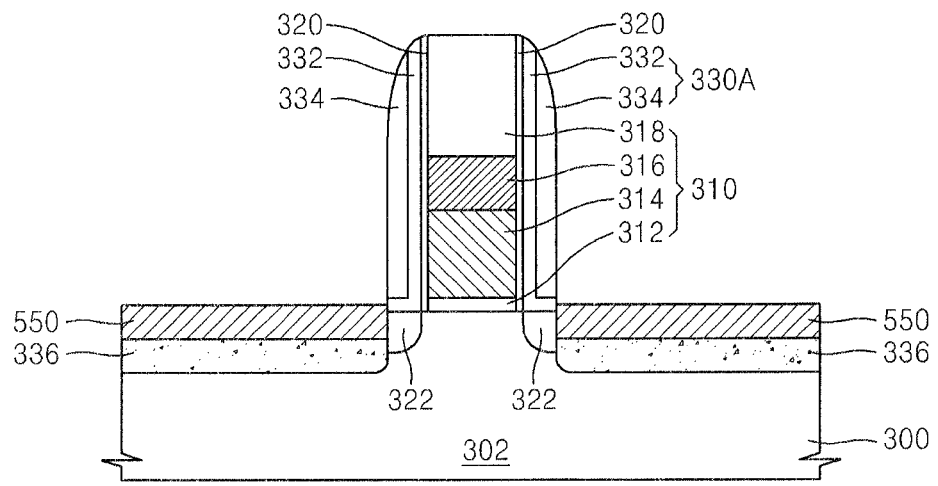
Figure 4C:
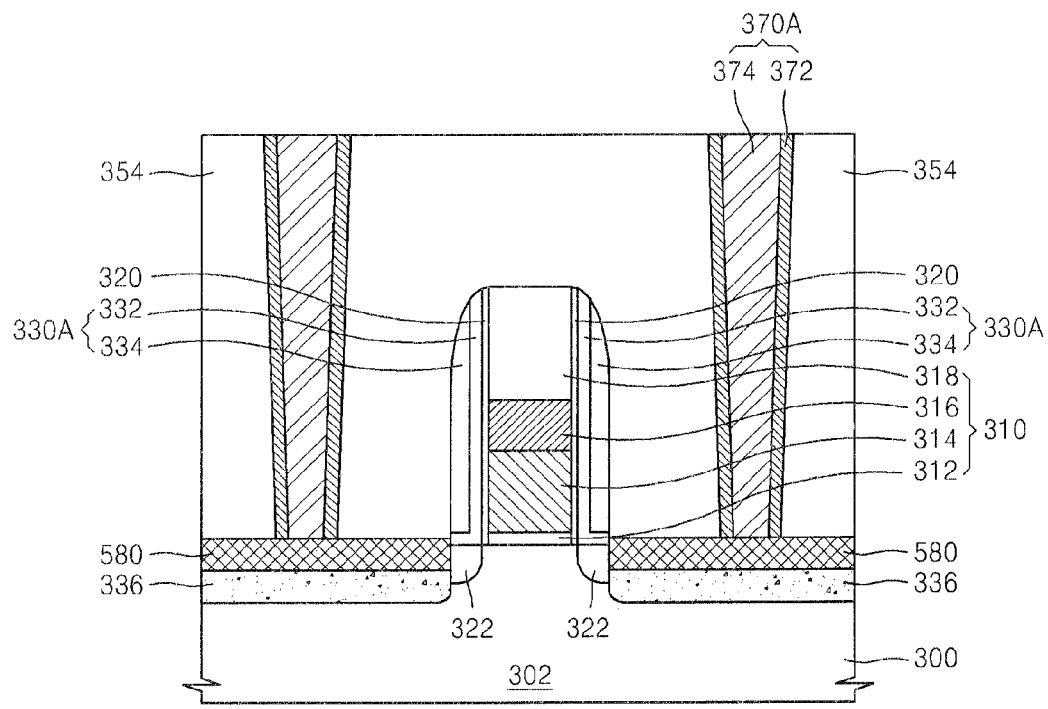

FIGS. 4A through 4C are cross-sectional views illustrating a semiconductor device and a method of fabricating the semiconductor device, according to another exemplary embodiment of the inventive concept.

The same reference numerals of FIGS. 4A through 4C as those of FIGS. 2A through 2J denote the same elements, and thus their detailed descriptions will be omitted herein. The current embodiment is the same as the previous embodiment of FIGS. 2A through 2J except that a recessed surface 300R is formed on an upper surface of a substrate 300, and source/drain regions 336 and a metal silicide layer 580 are formed on the recessed surface 300R.

According to the same process as that described with reference to FIGS. 2A through 2C, a gate stack 310 is formed on the substrate 300, and an offset insulating layer 320 and a spacer insulating layer 330 (not shown) are formed on both sidewalls of the gate stack 310. An LDD junction region 322 is formed in the substrate 300.

Referring to FIG. 4A, according to the same process as that described with reference to FIG. 2D, the spacer insulating layer 330 is etched back. Therefore, an insulating spacer 330A is formed on the substrate 300 to cover the offset insulating layer 320 on both sidewalls of the gate stack 310. Differently from the process described with reference to FIG. 2D, in the current embodiment, an etch atmosphere, which has been applied to the etch back process of the spacer insulating layer 330, is further maintained for a predetermined period of time even after an upper surface of the substrate 300 is exposed due to the formation of the spacer insulating layer 330. Therefore, the substrate 300 is etched from the upper surface thereof to a predetermined depth DS to form the recessed surface 300R on the upper surface of the substrate 300. According to the same process as that described with reference to FIG. 2D, the source/drain regions 336 are formed in the substrate 300 having the recessed surface 300R.

Referring to FIG. 4B, according to the same process as that described with reference to FIG. 2E, a sacrificial layer 550 is formed. The sacrificial layer 550 corresponds to the sacrificial layer 350 of FIG. 2E, and thus its descriptions will be omitted. However, in FIG. 4B, the sacrificial layer 550 is formed on the substrate 300 having the recessed surface 300R.

Referring to FIG. 4C, the same processes as those described with reference to FIGS. 2F through 2J are performed to form an insulating layer 354, contact plugs 370A including first and second conductive layers 372 and 374, and a metal silicide layer 580. Differently from the process described with reference to FIG. 2I, in the current embodiment, the metal silicide layer 580 is formed on the substrate 300 having the recessed surface 300R.

The semiconductor device and the method of FIGS. 4A through 4C obtain the same effects as those of the semiconductor device and the method of FIGS. 2A through 2J.

Also, in the current embodiment, a lower surface of the metal silicide layer 580 is formed on a lower level than an upper surface of the LDD junction region 322. Since the source/drain regions 336 are formed underneath the recessed surface 300R of the substrate 300, a distance between the source/drain regions 336 formed under both sides of the gate stack 310 increases. Therefore, in the semiconductor device fabricated using the method of the current embodiment, a short channel effect of a transistor is further prevented.

Figure 5A:
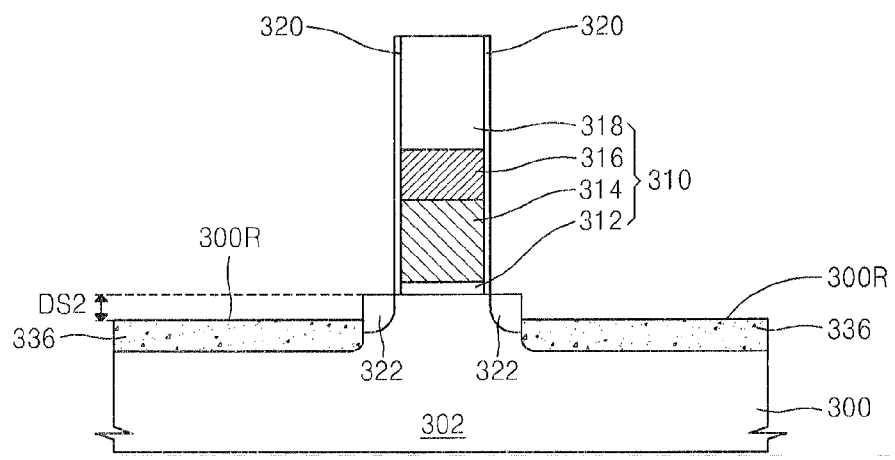
FIGS. 5A through 5C are cross-sectional views illustrating a semiconductor device and a method of fabricating the semiconductor device, according to another exemplary embodiment of the inventive concept.
Figure 5B:
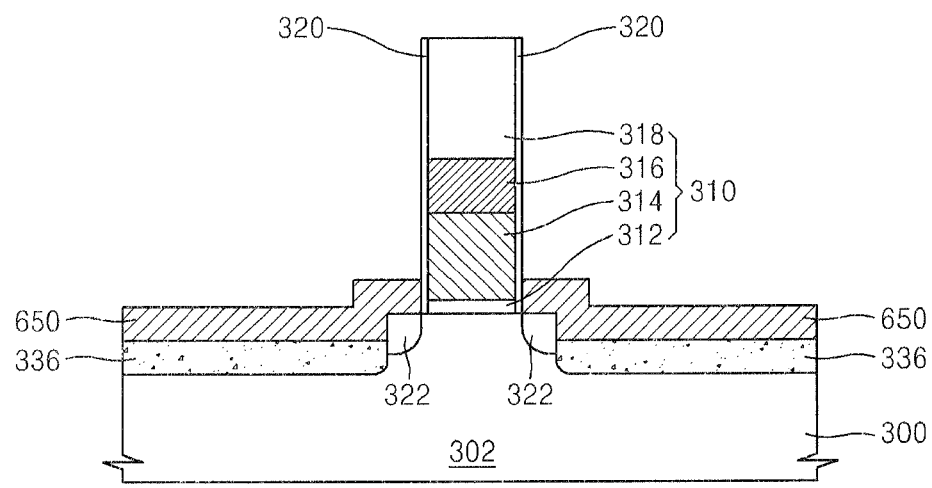
Figure 5C:
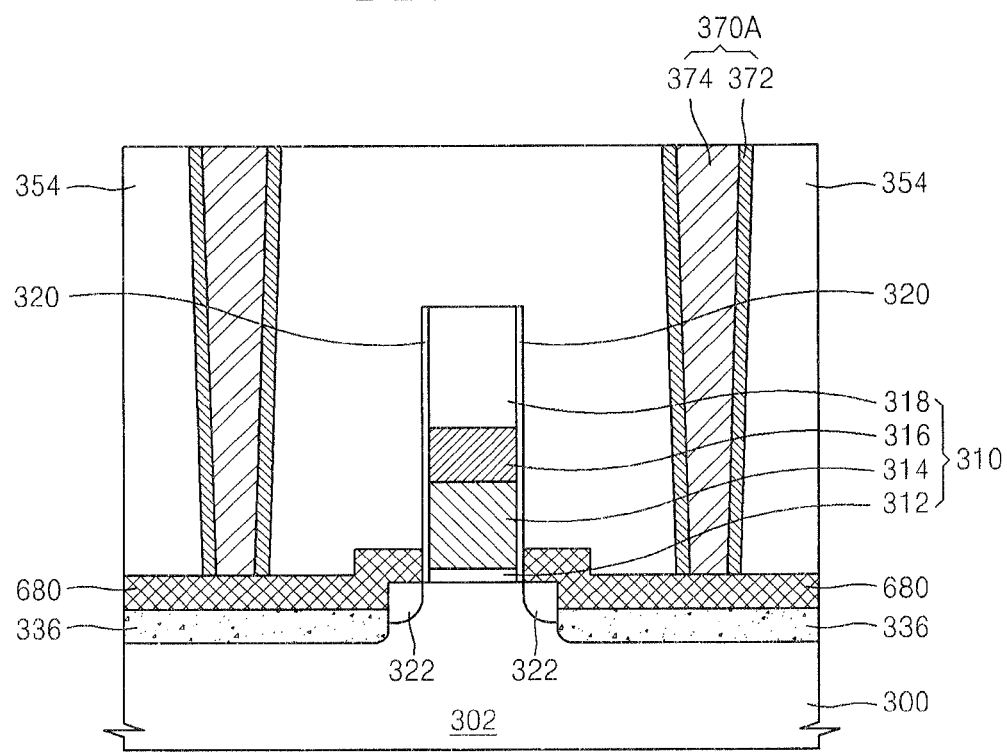

FIGS. 5A through 5C are cross-sectional views illustrating a semiconductor device and a method of fabricating the semiconductor device, according to another exemplary embodiment of the inventive concept.

The same reference numerals of FIGS. 5A through 5C as those of FIGS. 3A through 3F and FIGS. 4A through 4C denote the same elements, and thus their detailed descriptions will be omitted herein.

The current embodiment is the same as the previous embodiments of FIGS. 2A through 2J and FIGS. 4A through 4C, except that a metal silicide layer 680 is formed even on an LDD junction region 322, a recessed surface 300R is formed on an upper surface of a substrate 300, and source/drain regions 336 and the metal silicide layer 680 are formed on the recessed surface 300R.

In more detail, according to the same process as that described with reference to FIG. 4A, a gate stack 310 is formed on the substrate 300, and an offset insulating layer 320 and an insulating spacer 330A are formed on both sidewalls of the gate stack 310. The LDD junction region 322 is formed in the substrate 300, and the source/drain regions 336 are formed in the recessed surface 300R.

Referring to FIG. 5A, as described with reference to FIG. 3A, the insulating spacer 330A is removed. Therefore, the LDD junction region 322 formed in the substrate 300 is exposed, and a surface of the substrate 300 having the recessed surface 300R is exposed.

Referring to FIG. 5B, according to the same process as that described with reference to FIG. 3E, a sacrificial layer 650 is formed on the LDD junction region 322 and the source/drain regions 336. The sacrificial layer 650 corresponds to the sacrificial layer 350 or 450 of FIG. 2E or 3C, and thus its detailed descriptions will be omitted herein. However, in FIG. 5B, the sacrificial layer 650 is formed on the source/drain regions 336 formed in the substrate 300 having the recessed surface 300R and on the LDD junction region 322.

Referring to FIG. 5C, the same processes as those described with reference to FIGS. 2F through 2J are performed to form an insulating layer 354, contact plugs 370A including first and second conductive layers 372 and 374, and the metal silicide layer 680. Differently from the process described with reference to FIG. 2J, in the current embodiment, the metal silicide layer 680 is formed on the source/drain regions 336 and the LDD junction region 322. The metal silicide layer 680 is also formed on the substrate 300 having the recessed surface 300R.

The semiconductor device and the method of FIGS. 5A through 5C obtain the same effects as those of the semiconductor devices and the methods of FIGS. 2A through 2J and FIGS. 4A through 4C.

FIGS. 6A through 6D are cross-sectional views illustrating a semiconductor device and a method of fabricating the semiconductor device, according to another exemplary embodiment of the inventive concept.

The same reference numerals of FIGS. 6A through 6D as those of FIGS. 2A through 2J denote the same elements, and thus their detailed descriptions will be omitted herein. The current embodiment is the same as the previous embodiment of FIGS. 2A through 2J except that an LDD junction region 322 is formed after source and drain regions 336 are formed, and a metal silicide layer 780 is formed on the source and drain regions 336.

In more detail, according to the same process as that described with reference to FIGS. 2A through 2D, a gate stack 310 is formed on a substrate 300, and an offset insulating layer 320 and an insulating spacer 330A are formed on both sidewalls of the gate stack 310. In the current embodiment, the LDD junction region 322 is not formed according to the same process as that described with reference to FIG. 2B.

Figure 6A:
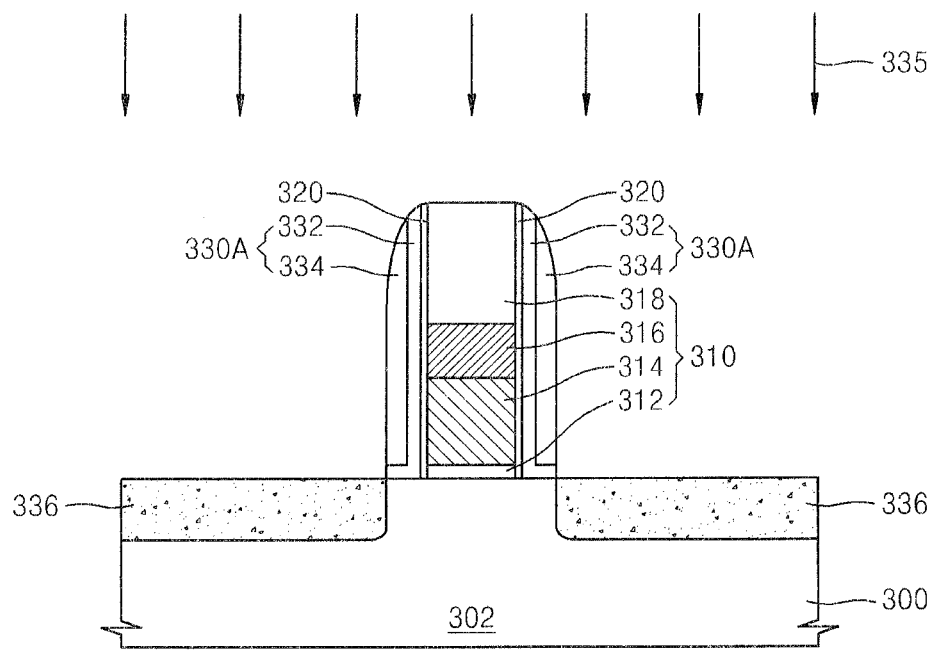
FIGS. 6A through 6D are cross-sectional views illustrating a semiconductor device and a method of fabricating the semiconductor device, according to another exemplary embodiment of the inventive concept.

Referring to FIG. 6A, as described with reference to FIG. 2D, impurity ions 335 for forming source/drain regions are injected into the substrate 300 using the gate stack 310, the offset insulating layer 320, and the insulating spacer 330A as ion implantation masks, thereby forming the source/drain regions 336.

Figure 6B:
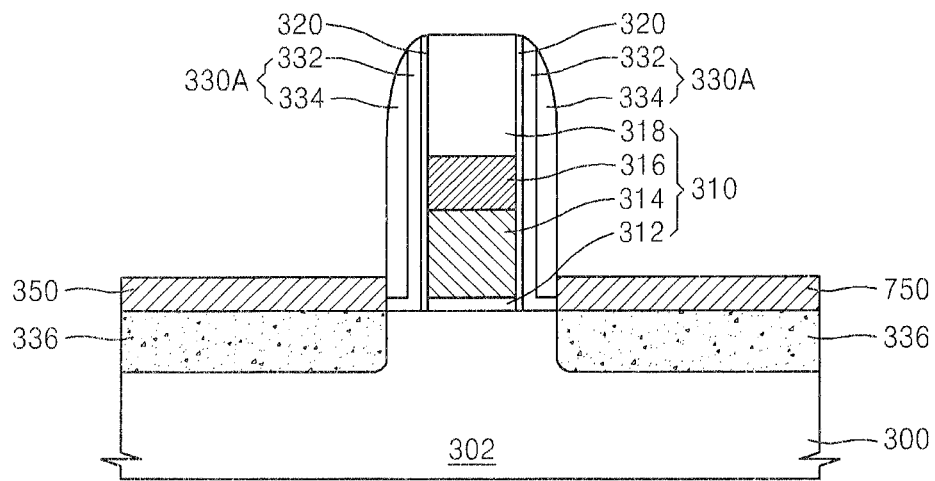

Referring to FIG. 6B, as described with reference to FIG. 2E, a sacrificial layer 750 is formed to cover the source/drain regions 336. The sacrificial layer 750 extends to the insulating spacer 330A along the source/drain regions 336 formed in the substrate 300.

Figure 6C:
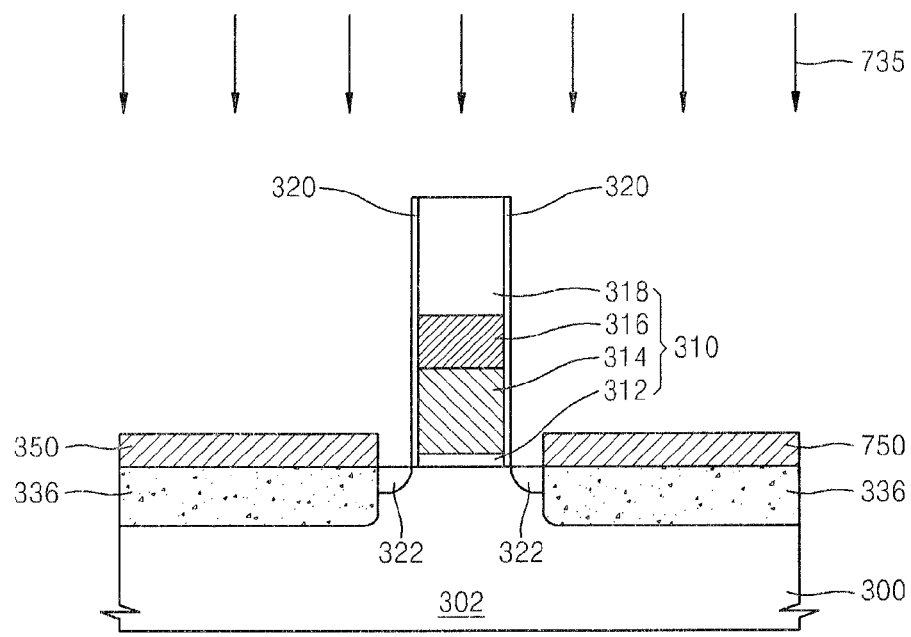

Referring to FIG. 6C, the insulating spacer 330A is removed using a wet etch method to expose a part of the substrate 300. The exposed part of the substrate 300 may be the LDD junction region 322 which will be described in a subsequent process. When the insulating spacer 330A is removed using the wet etch method, impurity ions of the source/drain regions 336 are not damaged due to the sacrificial layer 750.

As described with reference to FIG. 2B, impurity ions 735 for forming the LDD junction region 322 are injected into the substrate 300 using the gate stack 310 and the offset insulating layer 322 as ion implantation masks. Therefore, the LDD junction region 322 is formed in an upper of the substrate 300 under both sides of the gate stack 310. In the current embodiment, the LDD junction region 322 is formed after the source/drain regions 336 are formed, and thus the LDD junction region 322 unburdens a thermal budget, thereby improving a short channel effect.

Figure 6D:
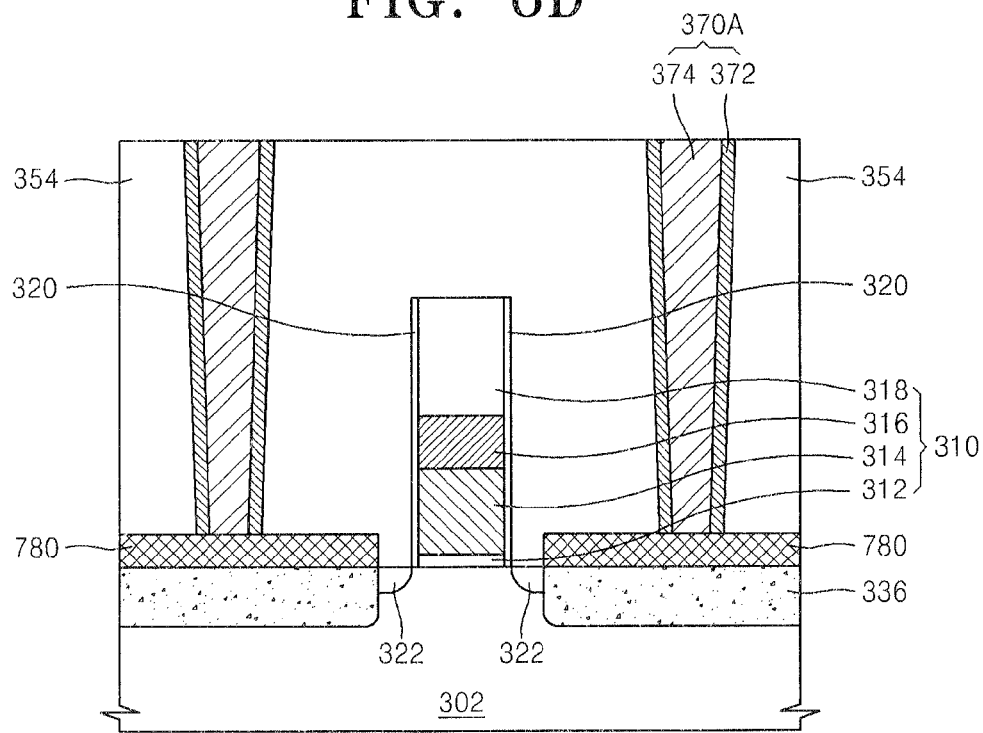

Referring to FIG. 6D, the same processes as those described with reference to FIGS. 2F and 2J are performed to form an insulating layer 354, contact plugs 370a including first and second conductive layers 372 and 374, and the metal silicide layer 780. However, differently from the process described with reference to FIG. 2J, in the current embodiment, the metal silicide layer 780 is formed merely on the source and/drain regions 336.

The semiconductor device and the method of FIGS. 6A through 6D obtain the same effects as those of the semiconductor device and the method of FIGS. 2A through 2J. Also, when the insulating spacer 330A is removed using a wet etch method, impurity ions of the source/drain regions 336 are not damaged due to the sacrificial layer 750, thereby improving reliability of the source/drain regions 336. In addition, since the LDD junction region 322 is formed after the source/drain regions 336 are formed, the LDD junction region 322 unburdens a thermal budget, thereby improving a short channel effect.

Figure 7A:
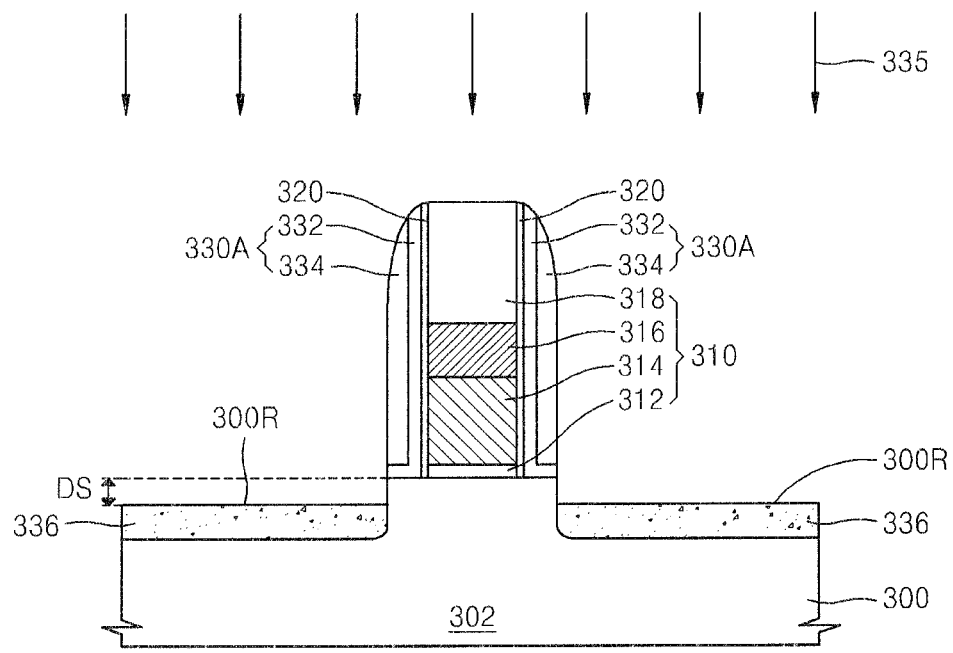
FIGS. 7A through 7C are cross-sectional views illustrating a semiconductor device and a method of fabricating the semiconductor device, according to another exemplary embodiment of the inventive concept.
Figure 7B:
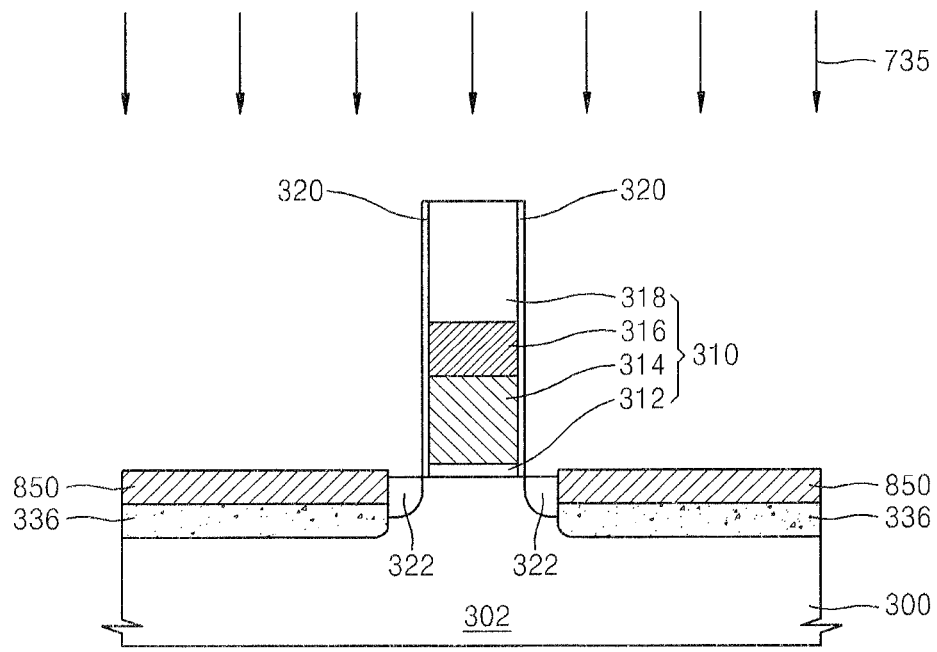
Figure 7C:
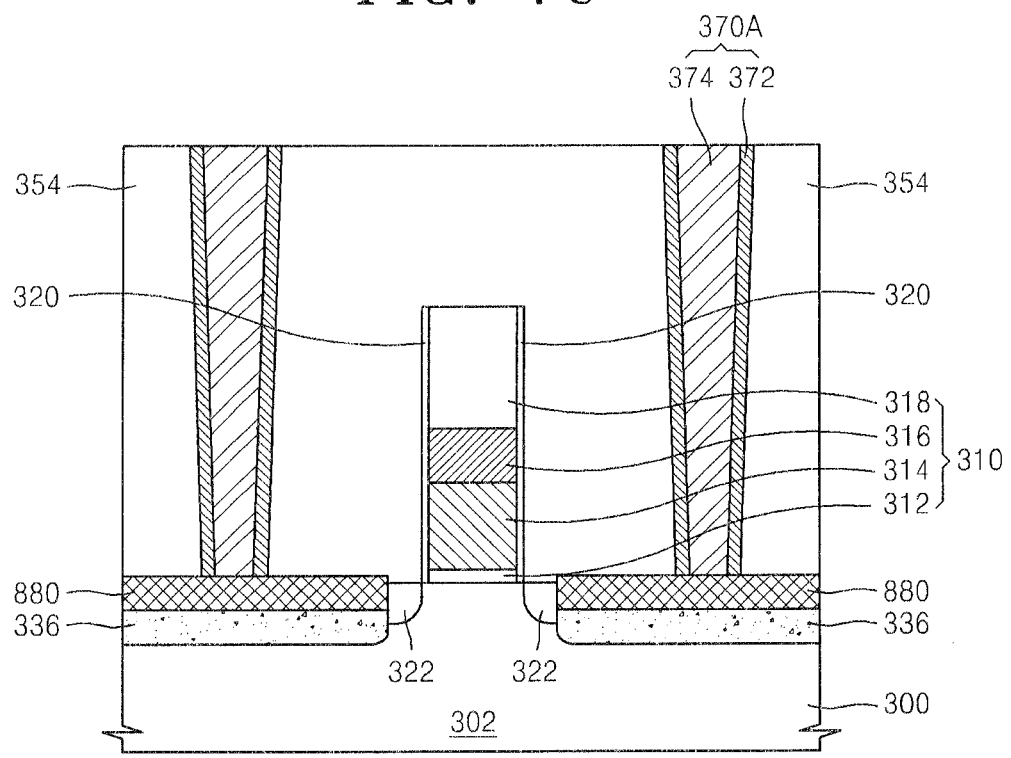

FIGS. 7A through 7C are cross-sectional views illustrating a semiconductor device and a method of fabricating the semiconductor device, according to another exemplary embodiment of the inventive concept.

The same reference numerals of FIGS. 7A through 7C as those of FIGS. 2A through 2J and FIGS. 4A through 4C denote the same elements, and thus their detailed descriptions will be omitted herein.

The current embodiment is the same as the previous embodiment of FIGS. 6A through 6C except that a recessed surface 300R is formed on an upper surface of a substrate 300. In other words, source/drain regions 336 and a metal silicide layer 880 are formed on the recessed surface 300R, and an LDD junction region 322 is formed after source/drain regions 336 are formed.

In more detail, according to the same process as that described with reference to FIGS. 2A through 2D, a gate stack 310 is formed on the substrate 300, and an offset insulating layer 320 and an insulating spacer 330A are formed on both sidewalls of the gate stack 310. However, in the current embodiment, the LDD junction region 322 is not formed as described with reference to FIG. 2B, but the recessed surface 300R is formed as described with reference to FIG. 4A.

Referring to FIG. 7A, as described with reference to FIG. 2D, impurity ions 335 for forming source/drain regions are injected into the substrate 300 having the recessed surface 300R using the gate stack 310, the offset insulating layer 320, and the insulating spacer 330A as ion implantation masks, thereby forming the source/drain regions 336.

Referring to FIG. 7B, as described with reference to FIGS. 2E, 6B, and 6C, a sacrificial layer 850 is formed to cover the source/drain regions 336. The sacrificial layer 850 extends to the insulating spacer 330A along the source/drain regions 336 formed in the substrate 300.

The insulating spacer 330A is removed using a wet etch method to expose a part of the substrate 300. The exposed part of the substrate 300 corresponds to a part which is to be the LDD junction region 322 to be formed in a subsequent process. When the insulating spacer 330A is removed using the wet etch method, impurity ions of the source/drain regions 336 are not damaged due to the sacrificial layer 850.

As described with reference to FIG. 2B, an LDD ion implantation process is performed with respect to the substrate 300 using the gate stack 310 and the offset insulating layer 320 as ion implantation masks, thereby forming the LDD junction region 322 under both sides of the gate stack 310. In the current embodiment, the LDD junction region 322 is formed after the source/drain regions 336 are formed, and thus the LDD junction region 322 unburdens a thermal budget, thereby improving a short channel effect.

Referring to FIG. 7C, the same processes as those described with reference to FIG. 2F through 2J are performed to form an insulating layer 354, contact plugs 370A including first and second conductive layers 372 and 374, and a metal silicide layer 880. However, differently from the process described with reference to FIG. 2J, in the current embodiment, the metal silicide layer 880 is formed merely on the source/drain regions 336.

The semiconductor device and the method of FIGS. 7A through 7C obtain the same effects as those of the semiconductor devices and the methods of FIGS. 2A through 2J, FIGS. 4A through 4C, and FIGS. 6A through 6D.

The methods of the exemplary embodiments and their corresponding structures of semiconductor devices fabricated using the methods may be applied to various types of semiconductor devices used in various fields and to various regions of the semiconductor devices.

For example, the methods of the exemplary embodiments and the characteristic structures of semiconductor devices fabricated using the methods may be applied to various types of devices, such as a DRAM, a flash memory, a PRAM, a FRAM, an MRAM, an SRAM, an embedded memory logic, a CMOS image sensor, etc., and to cell array regions, core regions, peripheral circuit regions, logic regions, I/O regions, etc. of the various types of devices.

Detailed examples of applying the semiconductor devices according to the exemplary embodiments of the inventive concept to various types of semiconductor devices will now be described in more detail.

Figure 8A:
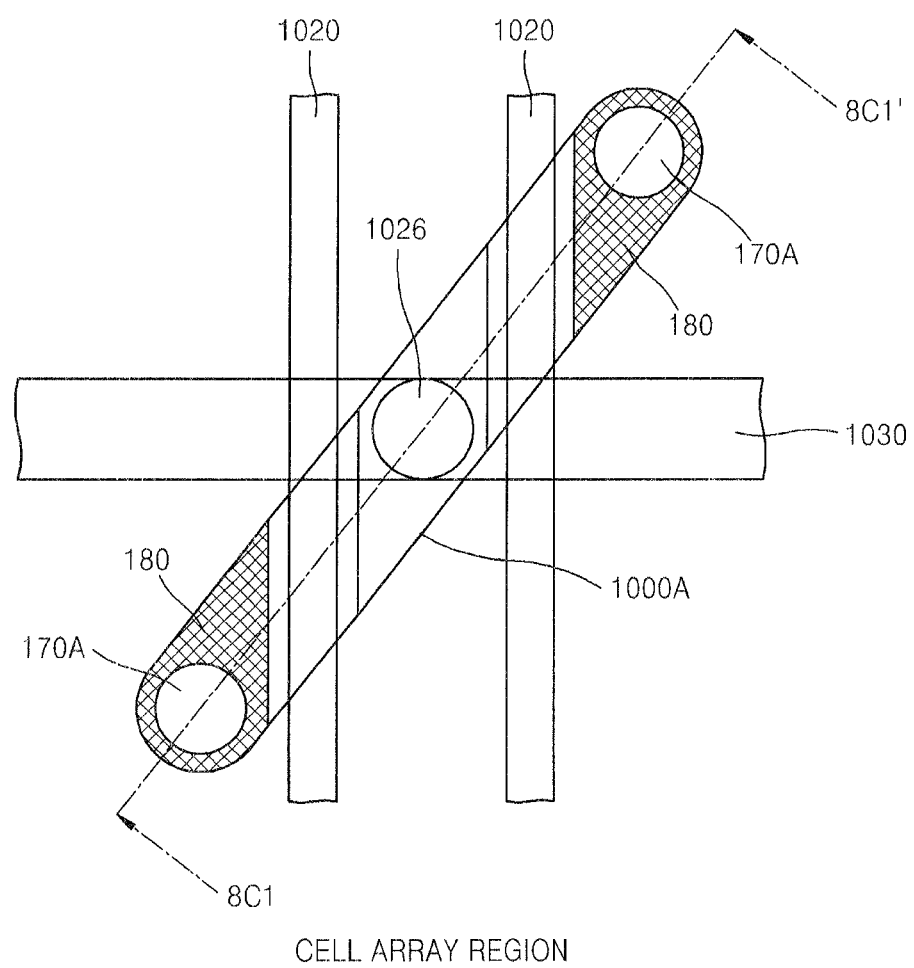
Figure 8B:
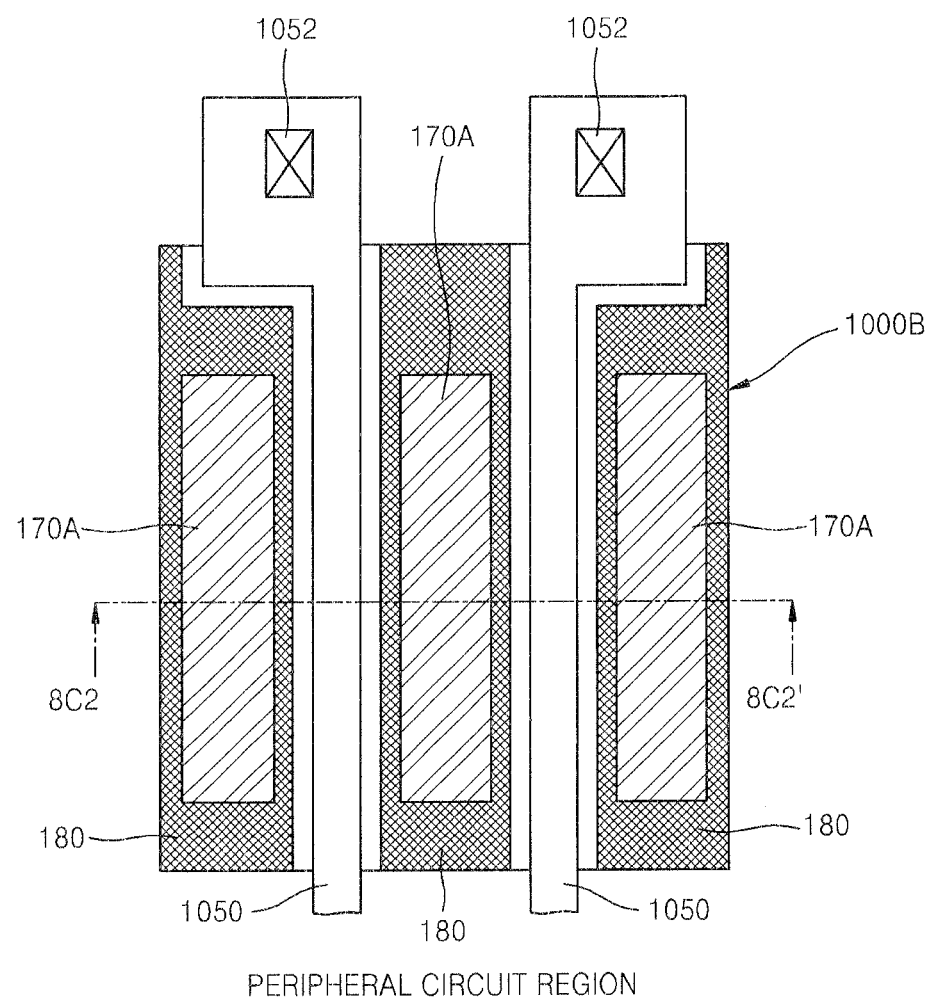

FIGS. 8A through 8C are drawings illustrating structures of a DRAM device, according to an exemplary embodiment of the inventive concept. In more detail, FIG. 8A illustrates a layout of a part of a cell array region of a DRAM device. FIG. 8B illustrates a layout of a part of a core or peripheral circuit region (hereinafter referred to as a peripheral circuit region) of the DRAM device. FIG. 8C is a cross-sectional view taken along a line 8C1-8C1' of FIG. 8A and a line 8C2-8C2' of FIG. 8B.

The same reference numerals of FIGS. 8A through 8C as those of FIGS. 1A through 1G and FIGS. 2A through 2J denote the same elements, and thus their detailed descriptions will be omitted herein.

Referring to FIGS. 8A through 8C, active regions 1000A and 1000B are formed in the cell array region and a peripheral circuit region of a substrate 1000, respectively. The active regions 1000A and 1000B are isolated from one another by an isolation layer 1010 as shown in FIG. 8C.

In the cell array region, a plurality of wordlines 1020 extend in parallel with one another on the substrate 1000. The plurality of wordlines 1020 constitute stack type transistors in FIG. 8C, but the inventive concept is not limited thereto. For example, the plurality of wordlines 1020 may be recess channel array transistors (RCATs).

A self-alignment contact 1024 is formed between the two adjacent ones of the wordlines 1020. A bitline 1030 is connected to the self-alignment contact 1024 through a direction contact 1026.

In the active region 1000A of the cell array region, contact plugs 170A are formed at the opposite side of the self-alignment contact 1024 across the wordlines 1020, electrically connecting source/drain regions 1032 and a capacitor (not shown) of the cell array region to each other.

The contact plugs 170A may be formed using the same process as that described with reference to FIGS. 1A through 1G. The contact plugs 170A include first and second conductive layers 172 and 174 as described with reference to FIGS. 1A through 1G. The contact plugs 170A may have a rectangular shape having width Wy in an y-axis direction that are about 5 times wider than width Wx in an x-axis direction as seen from their upper surfaces.

According to the same process as that described with reference to FIGS. 1A through 1G, a metal silicide layer 180 is formed on upper surfaces of the source/drain regions 1032. More specifically, the metal silicide layer 180 is formed on a whole part of the active region 1000A other than the wordlines 2020.

In the peripheral region, a plurality of gate electrodes 1050 and a plurality of contact parts 1052 are formed. According to a desired design, the plurality of gate electrodes 1050 may form low voltage (LV) transistors or high voltage (HV) transistors. Contact plugs 170A are formed at both sides of each of the gate electrodes 1050 and are respectively connected to source/drain regions 1034.

The contact plugs 170A formed in the peripheral region may have the same structures with those formed in the cell array region. The contact plugs 170A may be simultaneously formed in both the cell array region and the peripheral region. According to the same process as that described with reference to FIGS. 1A through 1G, the metal silicide layer 180 is formed on upper surfaces of the source/drain regions 1034 to which the contact plugs 170A are connected.

As shown in FIGS. 8A and 8B, in the active region 1000B of the peripheral region, the metal silicide layer 180 is formed on the upper surfaces of the source/drain regions 1034 positioned among the plurality of gate electrodes 1050. More specifically, the metal silicide layer 180 is formed on a whole part of the active region 1000B other than the gate electrode 1050.

Reference numerals 1100, 1200, and 1300 in FIG. 8C respectively denote insulating layers, i.e., interlayer insulating layers. In the above description, the embodiment of FIGS. 1A through 1G is applied to the embodiment of FIGS. 8A through 8C, but the inventive concept is not limited thereto. In other words, the embodiments of FIGS. 1A through 7C may be applied to the embodiment of FIGS. 8A through 8C.

Figure 9:
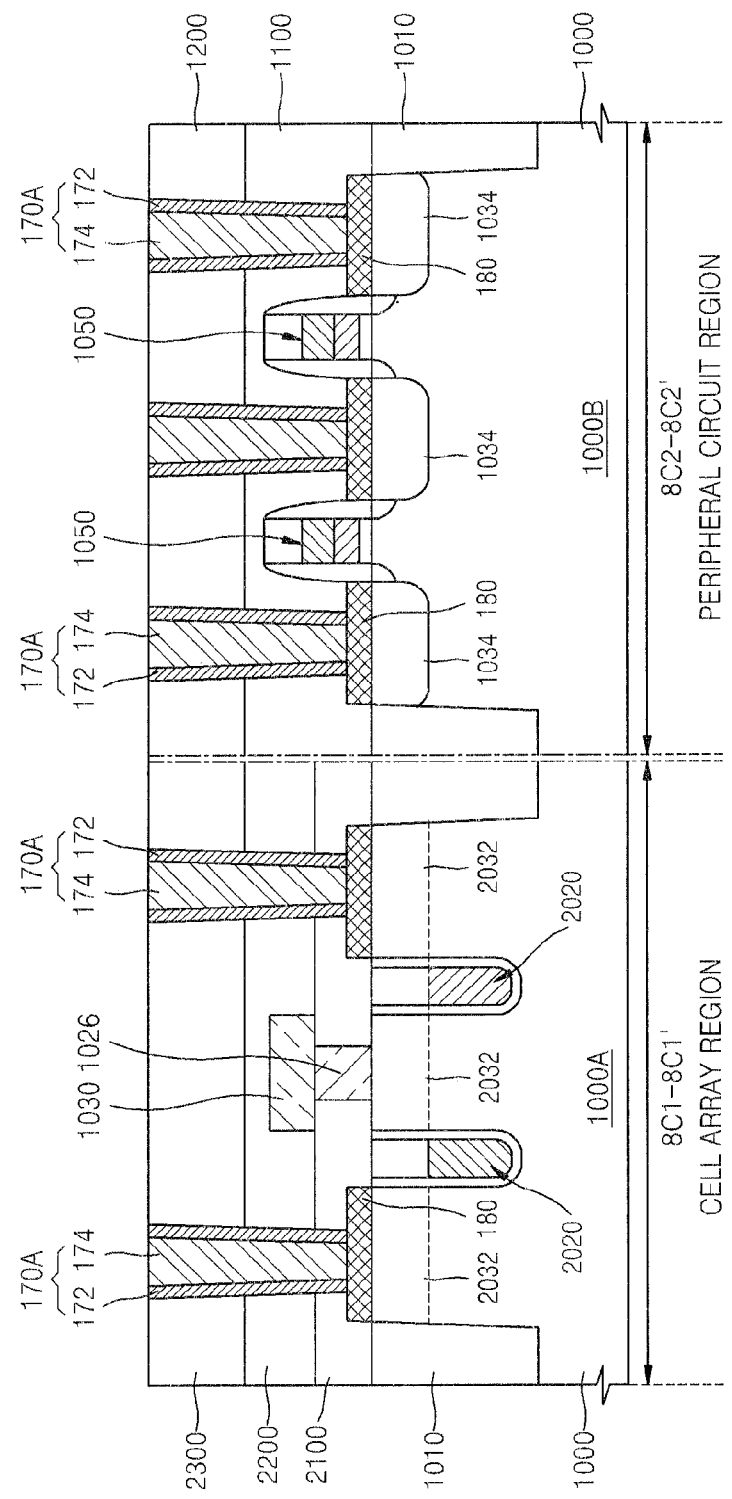
FIG. 9 is a cross-sectional view illustrating structures of important parts of a semiconductor device which is realized using the methods of the exemplary embodiments, according to another exemplary embodiment of the inventive concept.

FIG. 9 is a cross-sectional view illustrating structures taken along the line 8C1-8C1' of FIG. 8A and the line 8C2-8C2' of FIG. 8B of the DRAM device of FIGS. 8A and 8B. The same reference numerals of FIG. 9 as those of FIGS. 1A through 1G and FIGS. 8A through 8C denote the same elements, and thus their detailed descriptions will be omitted herein.

The semiconductor device of FIG. 9 has a similar structure to the semiconductor device of FIG. 8C, except that a plurality of wordlines 2020 are buried channel array transistors (BCATs) in a cell array region.

Referring to FIG. 9, the plurality of buried wordlines 2020 extend parallel with one another in the substrate 1000 in the cell array region. A direct contact 1026 is formed on the substrate 1000 and connected to a source/drain region 2032 formed between the two adjacent ones of the plurality of buried wordlines 2020. A bitline 1030 is electrically connected to the source/drain region 2032 through the direct contact 1026.

In an active region 1000A of the cell array region, contact plugs 170A are formed the opposite side of the direct contact 1026 across the buried wordlines 2020, electrically connecting the source/drain regions 2032 and a capacitor (not shown) of the cell array region to each other.

The contact plugs 170A may be formed using the same process as that described with reference to FIGS. 1A through 1G. In other words, the contact plugs 170A include first and second conductive layers 172 and 174 as described with reference to FIGS. 1A through 1G. According to the same process as that described with reference to FIGS. 1A through 1G, a metal silicide layer 180 is formed on upper surfaces of the source/drain regions 2032. More specifically, the metal silicide layer 180 is formed on a whole part of the active region 1000A other than the buried wordlines 2020.

A peripheral region may have the same structure as that of the peripheral region of FIG. 8C, but the inventive concept is not limited thereto. Therefore, the peripheral region may have various structures within the scope of the inventive concept. Reference numerals 2100, 2200, and 2300 in FIG. 9 respectively denote insulating layers.

Figure 10A:
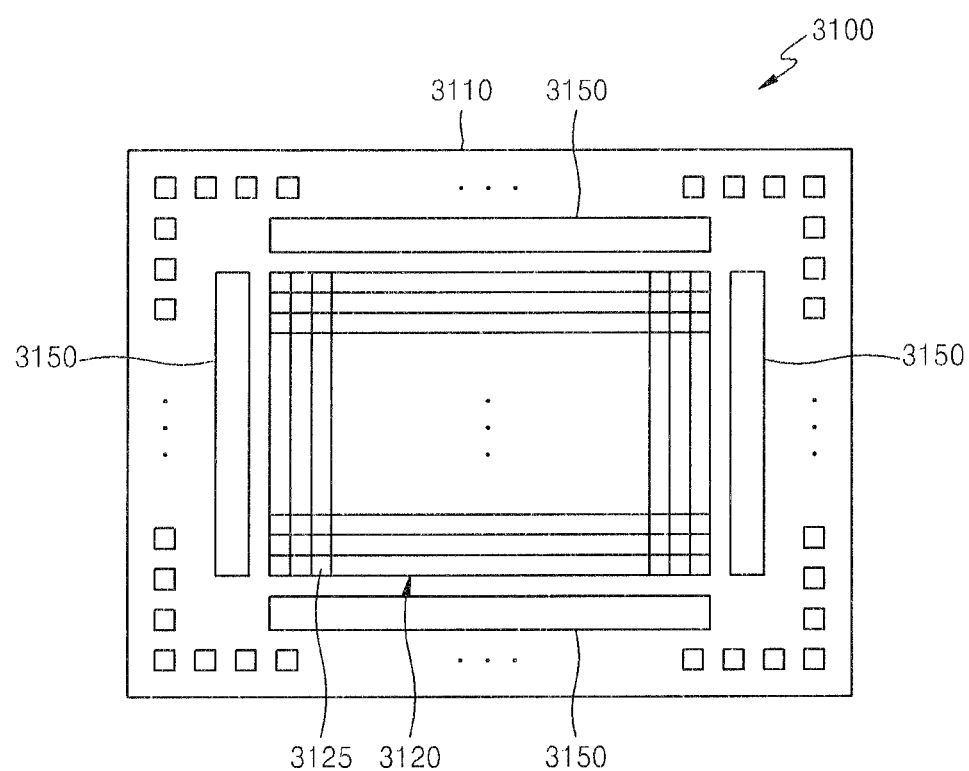
FIGS. 10A and 10B are, respectively, a block diagram and a cross-sectional view illustrating a CMOS image sensor device according to another exemplary embodiment of the inventive concept.
Figure 10B:
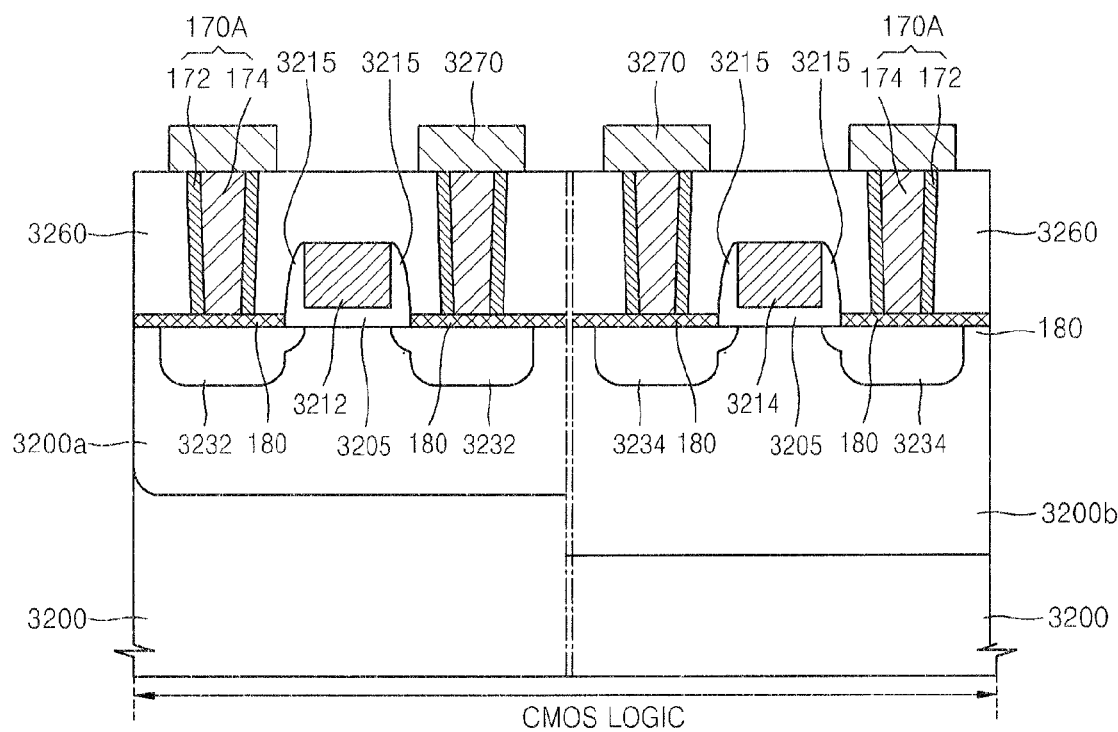

FIGS. 10A and 10B are, respectively, a block diagram and a cross-sectional view illustrating a CMOS image sensor device according to another exemplary embodiment of the inventive concept. In particular, FIG. 10B is a cross-sectional view illustrating the structure of a CMOS logic region 3150 of FIG. 10A.

The same reference numerals of FIGS. 10A and 10B as those of FIG. 1A through 1G denote the same elements, and thus their detailed descriptions will be omitted herein.

Referring to FIG. 10A, the CMOS image sensor 3100 includes a pixel array region 3120 and the CMOS logic region 3150 formed on a substrate 3110.

The pixel array region 3120 includes a plurality of unit pixels 3125 which are arrayed in a matrix form. The unit pixels 3125 include photodiodes, transfer transistors which transfer charges produced by the photodiodes, reset transistors which periodically reset floating diffusion (FD) regions which store the transferred charges, and source followers which buffer signals generated by the charges charging the FD regions.

A plurality of CMOS logic regions 3150 are respectively positioned close to edge parts of the pixel array region 3120. Each of the CMOS logic regions 3150 is formed of a plurality of CMOS transistors and provides a constant signal to each pixel of the pixel array region 3120 or controls a signal output from each pixel of the pixel array region 3120.

Referring to FIG. 10B, a p-type well 3200a and an n-type well 3200b are formed in a substrate 3200, e.g., a silicon substrate, in the CMOS logic region 3150. A gate electrode 3212 of an NMOS transistor is formed on a part of the substrate 3200 in which the p-type well 3200a is formed, and a gate electrode 3214 of a PMOS transistor is formed on a part of the substrate 3200 in which the n-type well 3200b is formed. Gate insulating layers 3205 are formed between the gate electrodes 3212 and 3214 and the substrate 3200, and insulating spacers 3215 are formed on both sidewalls of each of the gate electrodes 3212 and 3214.

Source/drain regions 3232 including n-type impurities are formed beside both sides of the gate electrode 3212 in the p-type well 3200a, and source/drain regions 3234 including p-type impurities are formed beside both sides of the gate electrode 3214 in the n-type well 3200b.

Contact plugs 170A penetrate insulating layers 3260 and are connected to the source/drain regions 3232 and 3234. As described with reference to FIGS. 1A through 1G, the contact plugs 170A include first and second conductive layers 172 and 174.

According to the same process as that described with reference to FIGS. 1A through 1G, a metal silicide layer 180 is formed on upper surfaces of the source/drain regions 3232 and 3234, on lower surfaces of the contact plugs 170A, and in regions around the contact plugs 170A. Metal wire lines 3270 are formed on the insulating layer 3260 and are connected to the contact plugs 170A.

Figure 11:
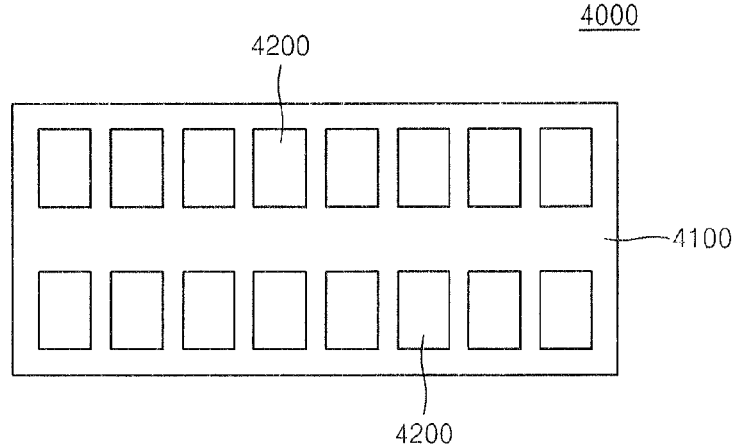
FIG. 11 is a top view of a memory module including semiconductor devices, according to an exemplary embodiment of the inventive concept.

FIG. 11 is a plan top of a memory module 4000 including semiconductor devices, according to an exemplary embodiment of the inventive concept.

In more detail, the memory module 4000 includes a printed circuit board 4100 and a plurality of semiconductor packages 4200. The plurality of semiconductor packages 4200 may respectively include semiconductor devices which are fabricated using the methods according to the exemplary embodiments of the inventive concept.

In particular, the plurality of semiconductor packages 4200 may respectively include semiconductor devices which are fabricated according to the above-described exemplary embodiments of the inventive concept. The plurality of semiconductor packages 4200 may include at least one of the semiconductor devices described above.

The memory module 4000 of the current embodiment may be a single in-line memory module (SIMM) which includes the plurality of semiconductor packages 4200 mounted on a side of a PCB or a dual in-line memory module (DIMM) which includes the plurality of semiconductor packages 4200 mounted on both sides of the PCB. The memory module 4000 may also be a fully buffered DIMM (FBDIMM) which includes advanced memory buffers (AMBs) respectively provided to the plurality of semiconductor packages 4200.

Figure 12:
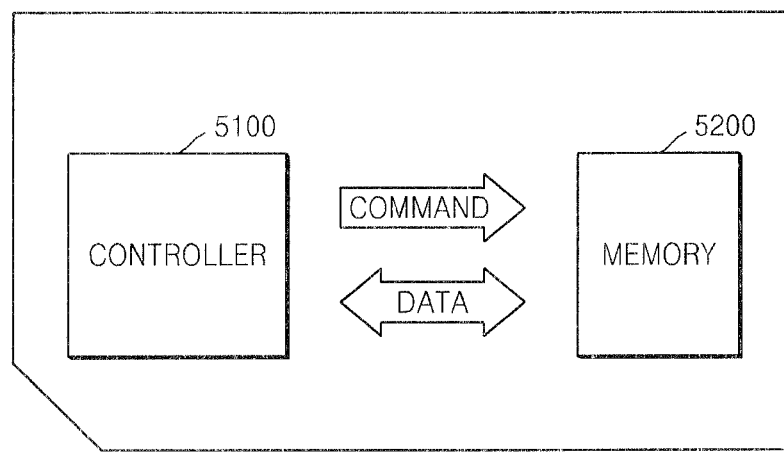
FIG. 12 is a schematic block diagram of a memory card including semiconductor devices, according to an exemplary embodiment of the inventive concept.

FIG. 12 is a schematic block diagram of a memory card 5000 including semiconductor devices, according to an exemplary embodiment of the inventive concept.

In more detail, the memory card 5000 includes a controller 5100 and a memory 5200 which are arranged to exchange electric signals with each other. For example, when the controller 5100 transmits a command to the memory 5200, the memory 5200 transmits data to the controller 5100.

The memory 5200 may include semiconductor devices which are fabricated using the methods according to the exemplary embodiments of the inventive concept. In particular, the memory 5200 may include semiconductor devices which are fabricated according to the above-described exemplary embodiments of the inventive concept. The memory 5200 may include at least one of the semiconductor devices described above.

The memory card 5000 may be various types of memory cards, e.g., a memory stick card, a smart media (SM) card, a secure digital (SD) card, a mini-secure digital (mini SD) card, a multimedia card (MMC), etc.

Figure 13:
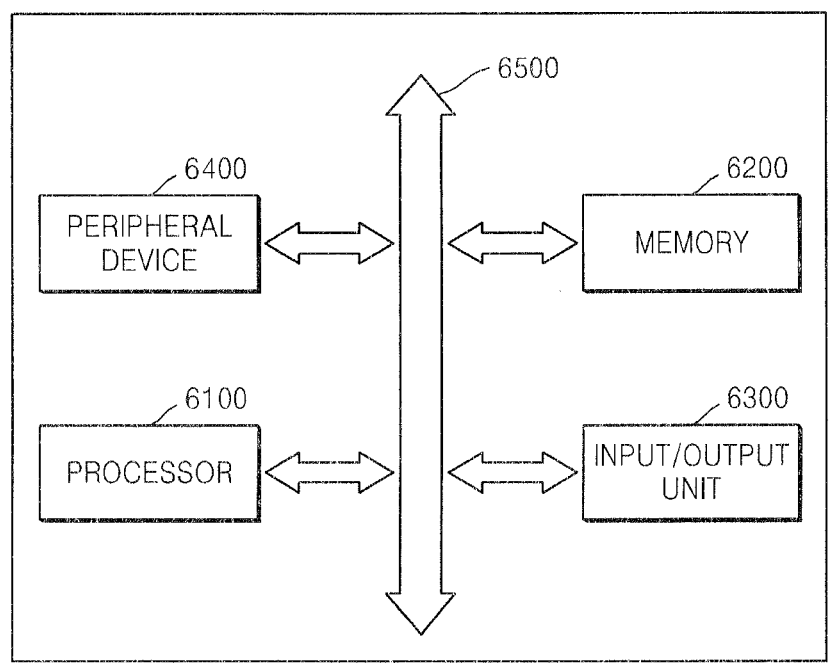
FIG. 13 is a schematic block diagram of a system including semiconductor devices, according to an exemplary embodiment of the inventive concept.

FIG. 13 is a schematic block diagram of a system 6000 including semiconductor devices, according to an exemplary embodiment of the inventive concept.

In more detail, the system 6000 includes a processor 6100, an input/output (I/O) unit 6300, and a memory 6200. The memory 6200 communicates data with other devices through a bus 6500. The memory 6200 may include a random access memory (RAM) and a read only memory (ROM). The system 6000 further includes a peripheral device 6400 such as a floppy disk drive, a compact disk (CD) ROM drive, or the like.

The memory 6200 may include semiconductor devices which are fabricated using the methods according to the exemplary embodiments of the inventive concept. In particular, the memory 6200 may include semiconductor devices which are fabricated according to the above-described exemplary embodiments of the inventive concept. The memory 6200 may include at least one of the semiconductor devices described above. The memory 6200 stores codes and data for an operation of the processor 6100.

The system 6000 may be applied to a mobile phone, an MP3 player, a navigation system, a portable multimedia player (PMP), a solid state disk (SSD), or household appliances.

As described above, a semiconductor device according to the inventive concept has contact plugs with reduced contact resistance Rc, and as a result the contact plugs are smaller in diameter or contact area. In turn, the area of an active region can be reduced, thereby further reducing a chip size. In addition, reduction of the area of the contact plugs may lead to reduction of the parasitic resistance from the contact plugs.

Also, although pitches of a plurality of gates formed on a substrate are reduced to minute sizes, a metal silicide layer is formed in second openings. Therefore, an ultra-thin film type metal silicide layer of a minute thickness, which is appropriate to apply to a very large scale integration (VLSI) semiconductor device, is formed between two adjacent gates. Therefore, when the semiconductor device is fabricated, a design margin among unit devices is secured, and electric characteristics of the semiconductor device are improved, thereby further reducing a size of the semiconductor device and improving cost price competitiveness of the semiconductor device.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a substrate;
   a gate structure formed on the substrate;
   a channel region below the gate structure in the substrate;
   a first source/drain region and a second source/drain region located at opposite side of the gate structure;
   a first lightly-doped drain (LDD) junction region formed between the first source/drain region and one end of the channel region;
   a second lightly-doped drain (LDD) junction region formed between the second source/drain region and the other end of the channel region;
   a metal silicide layer having a first metal formed on the first and second source/drain regions;
   an insulating layer formed on the metal silicide layer and the gate structure having a first opening to expose the metal silicide layer; and
   a conductive layer having the first metal and filling the first opening to contact the metal silicide layer, wherein the conductive layer includes a barrier layer having the first metal and a contact plug, and wherein the barrier layer is formed on an inner sidewall of the first opening and the contact plug is formed on the barrier layer, and wherein the barrier layer and the contact plug are in direct contact with the metal silicide layer.

2. The semiconductor device of claim 1, wherein the conductive layer includes the barrier layer formed on an inner sidewall of the first opening and the contact plug formed on the barrier layer and the metal silicide, wherein the barrier layer includes the first metal.

3. The semiconductor device of claim 1, wherein the conductive layer is a single layer having the first metal.

4. The semiconductor device of claim 1, wherein the metal silicide layer is further formed on the first and second LDD junction regions.

5. The semiconductor device of claim 1, wherein the first and second source/drain regions are formed in a recessed region of the substrate, wherein a top surface of the recessed region is positioned at the first LDD junction region and the second LDD junction.

6. The semiconductor device of claim 5, wherein the metal silicide layer is further formed on the first and second LDD junction region.

7. The semiconductor device of claim 1, wherein the first metal is a metal selected from the group consisting of titanium (Ti), cobalt (Co), nickel (Ni), hafnium (Hf), platinum (Pt), and tungsten (W).

8. The semiconductor device of claim 1, wherein the metal silicide layer is self-aligned with an upper surface of the first and second source/drain regions.

9. The semiconductor device of claim 1, wherein the gate structure has sidewalls on either side of the gate structure and the LDD junction region is formed under the sidewalls of the gate structure.

10. The semiconductor device of claim 9, wherein the first and second source/drain regions are formed in a recessed region of the substrate, wherein a top surface of the recessed region is aligned with the first and second lightly-doped drain (LDD) junction regions.

11. The semiconductor device of claim 1, wherein the metal silicide layer has a smaller electrical resistance than that of the first and second source/drain regions, and the metal silicide layer has a thickness less than a junction depth of the first and second source/drain regions.

12. The semiconductor device of claim 1, wherein the gate structure includes a polysilicon gate layer doped with impurities and a metal silicide gate layer stacked on the polysilicon gate layer.

13. A semiconductor device comprising:
   a substrate having an active region and an isolation region;
   a plurality of gate stack structures, each of gate stack structures locating between a first source/drain region and a second source/drain region;

a plurality of channel regions under the corresponding gate stack structures, each of channel regions having a first LDD junction region formed between the first source/drain region and one end of the channel region and a second LDD junction region formed between the second source/drain region and the other end of the channel region;

a metal silicide layer having a first metal formed on the active region other than the plurality of gate structures;

an insulating layer having a plurality of openings to expose the metal silicide layer; and a plurality of conductive layers filling the openings and contacting the metal silicide layer, wherein each of the plurality of conductive layers includes a barrier layer having the first metal and a contact plug, and wherein the barrier layer is formed on an inner sidewall of the plurality of openings and the contact plug is formed on the barrier layer, and wherein the barrier layer and the contact plug are in direct contact with the metal silicide layer.

14. The semiconductor device of claim 13, wherein the insulating layer includes a second opening which extends along an upper surface of the first and second source/drains and a first opening which is connected to the second opening and vertically extends from the first and second source/drains.

15. The semiconductor device of claim 13, wherein the insulating layer includes a second opening which extends along an upper surface of the first and second source/drains and a first opening which is connected to the second opening and vertically extends from the first and second source/drains.

16. The semiconductor device of claim 13, wherein the metal silicide layer is further formed on the first and second LDD junction regions.

17. The semiconductor device of claim 13, wherein the first and second source/drain regions are formed in a recessed region of the substrate, wherein a top surface of the recessed region is positioned at the first LDD junction region and the second LDD junction.

18. The semiconductor device of claim 17, wherein the metal silicide layer is further formed on the first and second LDD junction region.

19. The semiconductor device of claim 13, wherein the metal silicide layer is self-aligned with an upper surface of the first and second source/drain regions.

* * * * *